United States Patent
Sachs

(10) Patent No.: US 7,708,829 B2
(45) Date of Patent: May 4, 2010

(54) METHOD AND APPARATUS FOR CRYSTAL GROWTH

(75) Inventor: Emanuel Michael Sachs, Newton, MA (US)

(73) Assignee: Evergreen Solar, Inc., Marlborough, MA (US)

( * ) Notice: Subject to any disclaimer, the term of this patent is extended or adjusted under 35 U.S.C. 154(b) by 575 days.

(21) Appl. No.: 11/483,438

(22) Filed: Jul. 10, 2006

(65) Prior Publication Data

US 2006/0249071 A1    Nov. 9, 2006

Related U.S. Application Data

(62) Division of application No. 10/688,864, filed on Oct. 17, 2003, now Pat. No. 7,407,550.

(60) Provisional application No. 60/419,769, filed on Oct. 18, 2002.

(51) Int. Cl.
*C30B 15/00* (2006.01)

(52) U.S. Cl. .............. 117/13; 117/11; 117/16; 117/18; 117/47; 117/211; 117/212; 117/903; 117/922

(58) Field of Classification Search ............ 117/11, 117/13, 16, 18, 47, 211, 212, 903, 922
See application file for complete search history.

(56) References Cited

U.S. PATENT DOCUMENTS

| | | |
|---|---|---|
| 3,031,403 A | 4/1962 | Bennett, Jr. |
| 3,058,915 A | 10/1962 | Bennett |
| 3,096,158 A | 7/1963 | Gauleé et al. |
| 3,298,795 A | 1/1967 | Hamilton et al. |
| 3,795,488 A | 3/1974 | Oliver |
| 3,980,438 A | 9/1976 | Castonguay et al. |
| 4,036,595 A | 7/1977 | Lorenzini et al. |
| 4,221,754 A | 9/1980 | Nowak |
| 4,299,648 A * | 11/1981 | Ciszek et al. .......... 117/26 |

(Continued)

FOREIGN PATENT DOCUMENTS

DE    37 36 341 A1    5/1989

(Continued)

OTHER PUBLICATIONS

Hoyler et al., "Fast SI Sheet Growth by the Horizontal Supported Web Technique," *Journal of Crystal Growth* vol. 79, pp. 572-577 (1986).

(Continued)

*Primary Examiner*—Robert M Kunemund
*Assistant Examiner*—Matthew J Song
(74) *Attorney, Agent, or Firm*—Sunstein Kann Murphy & Timbers LLP

(57) ABSTRACT

A method and apparatus for growing a crystalline or polycrystalline body from a melt is described, wherein the melt is retained by capillary attachment to edge features of a mesa crucible. The boundary profile of the resulting melt surface results in an effect which induces a ribbon grown from the surface of the melt to grow as a flat body. Further, the size of the melt pool is substantially reduced by bringing these edges close to the ribbon, thereby reducing the materials cost and electric power cost associated with the process.

37 Claims, 14 Drawing Sheets

U.S. PATENT DOCUMENTS

| | | | | |
|---|---|---|---|---|
| 4,334,948 A | | 6/1982 | Berkman et al. | |
| 4,402,786 A | * | 9/1983 | Little | 117/26 |
| 4,427,638 A | | 1/1984 | Ellis et al. | |
| 4,469,552 A | | 9/1984 | Thornhill | |
| 4,510,015 A | | 4/1985 | Ellis et al. | |
| 4,512,954 A | | 4/1985 | Matsui | |
| 4,520,752 A | | 6/1985 | Belouet | |
| 4,554,203 A | | 11/1985 | Grabmaier et al. | |
| 4,577,588 A | | 3/1986 | Mautref et al. | |
| 4,594,229 A | | 6/1986 | Ciszek et al. | |
| 4,627,887 A | | 12/1986 | Sachs | |
| 4,661,200 A | | 4/1987 | Sachs | |
| 4,689,109 A | | 8/1987 | Sachs | |
| 4,721,688 A | * | 1/1988 | Stormont et al. | 438/62 |
| 4,861,416 A | | 8/1989 | Morrison | |
| 4,936,947 A | | 6/1990 | Mackintosh | |
| 5,098,229 A | | 3/1992 | Meier et al. | |
| 5,102,494 A | | 4/1992 | Harvey et al. | 156/609 |
| 5,242,667 A | | 9/1993 | Koziol et al. | |
| 5,370,078 A | | 12/1994 | Kou et al. | |
| 5,462,011 A | * | 10/1995 | Tomzig et al. | 117/18 |
| 5,690,732 A | | 11/1997 | Otani et al. | |
| 5,723,337 A | | 3/1998 | Muller et al. | |
| 5,902,395 A | | 5/1999 | Nagai et al. | 117/18 |
| 5,911,826 A | | 6/1999 | Hiraishi et al. | |
| 6,090,199 A | | 7/2000 | Wallace, Jr. et al. | |
| 6,200,383 B1 | | 3/2001 | Wallace, Jr. et al. | |
| 6,217,649 B1 | * | 4/2001 | Wallace et al. | 117/47 |
| 2003/0053891 A1 | * | 3/2003 | Skarzenski et al. | 414/157 |
| 2004/0083946 A1 | | 5/2004 | Wallace, Jr. | |

FOREIGN PATENT DOCUMENTS

| | | |
|---|---|---|
| EP | 0 390 502 | 10/1990 |
| EP | 0 170 856 | 9/1991 |
| EP | 0 875 606 | 11/1998 |
| GB | 2 135 595 A | 9/1984 |
| JP | 53073481 | 6/1978 |
| JP | 58194798 | 11/1983 |
| JP | 59182293 | 10/1984 |
| WO | 01/04388 | 1/2001 |
| WO | WO01/04388 A2 | 1/2001 |

OTHER PUBLICATIONS

International Search Report for International Application No. PCT/US03/32851 dated Apr. 7, 2004 (6 pgs.).

Morrison (Feb. 1986), "Filament Guides for Silicon Ribbon Growth," NASA Tech. Briefs, USA, vol. 9, No. 2, 5 pgs.

Zoutendyk et al. (Mar. 1984), "Gas-Jet Meniscus Control in Ribbon Growth," NASA Tech. Briefs, USA, vol. 7, No. 3, 29 pgs.

PCT/US00/17651, International Search Report, Feb. 22, 2001, 3 pgs.

* cited by examiner

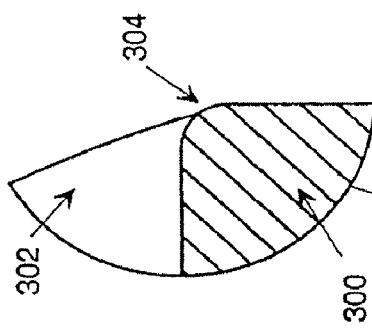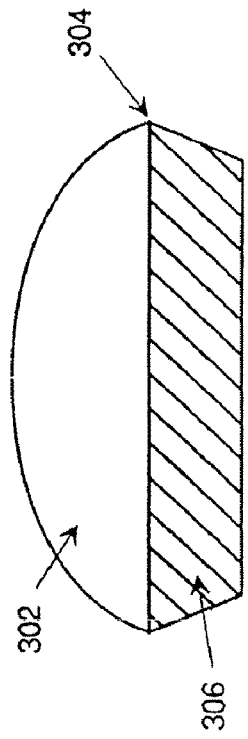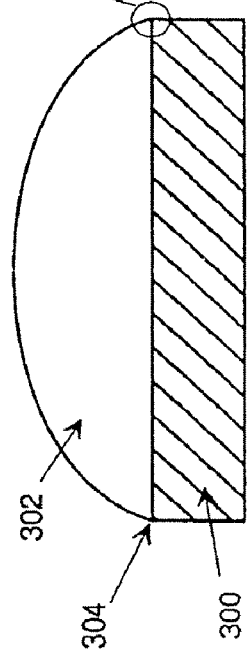
Fig. 7a
Fig. 7b
Fig. 7c

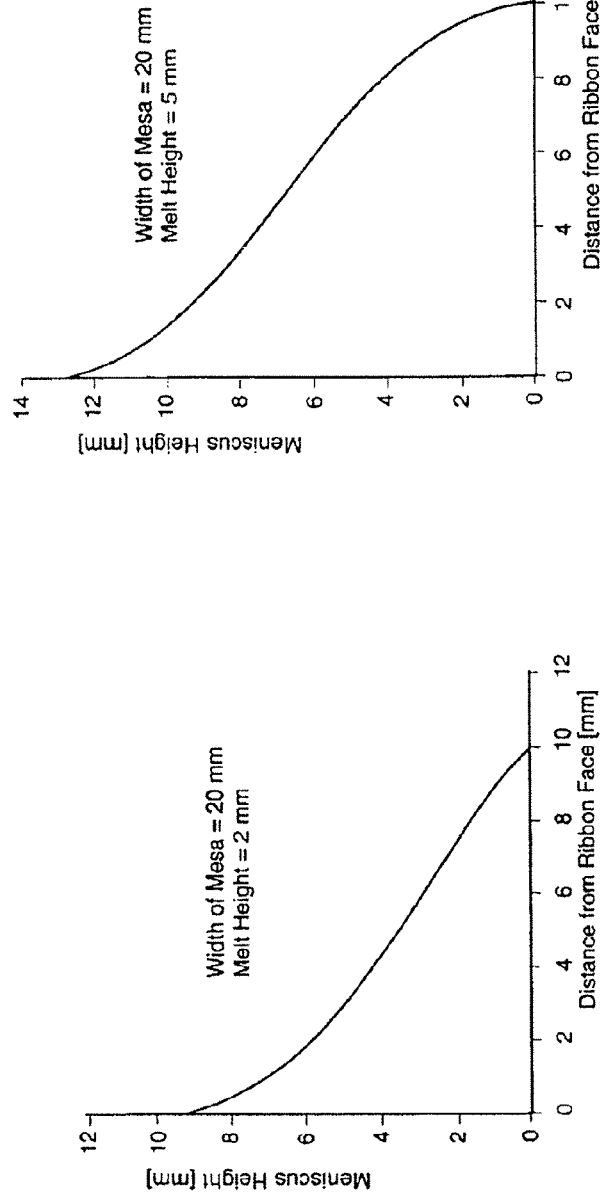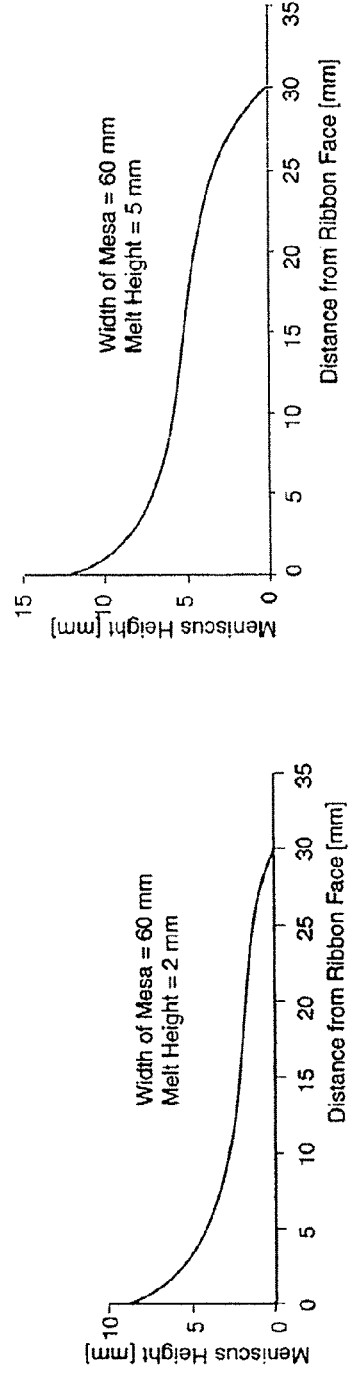
Fig. 9a
Fig. 9b
Fig. 9c
Fig. 9d

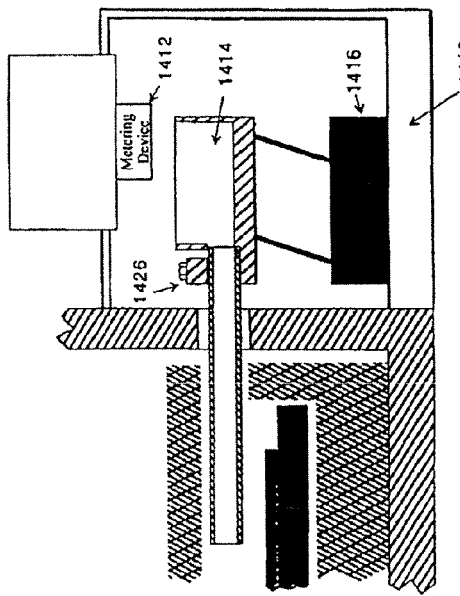
*Fig. 13a*
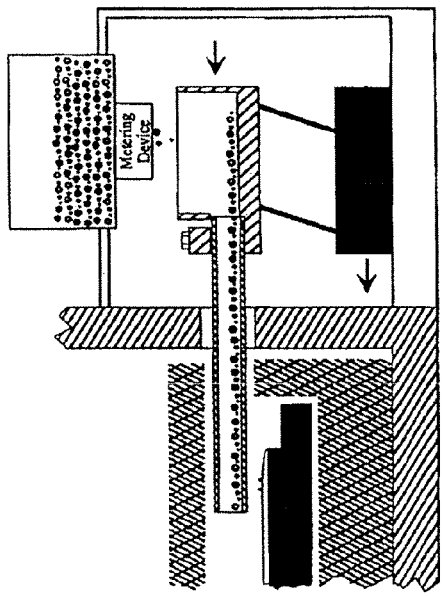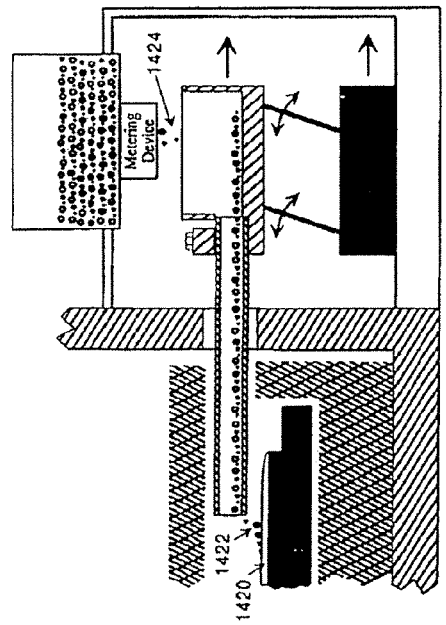
*Fig. 13b*
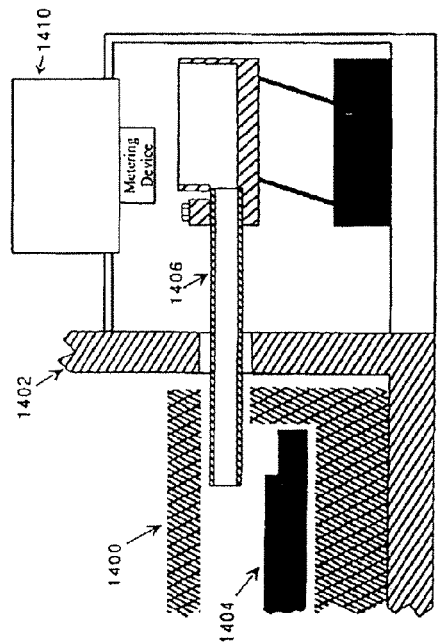
*Fig. 13c*
*Fig. 13d*

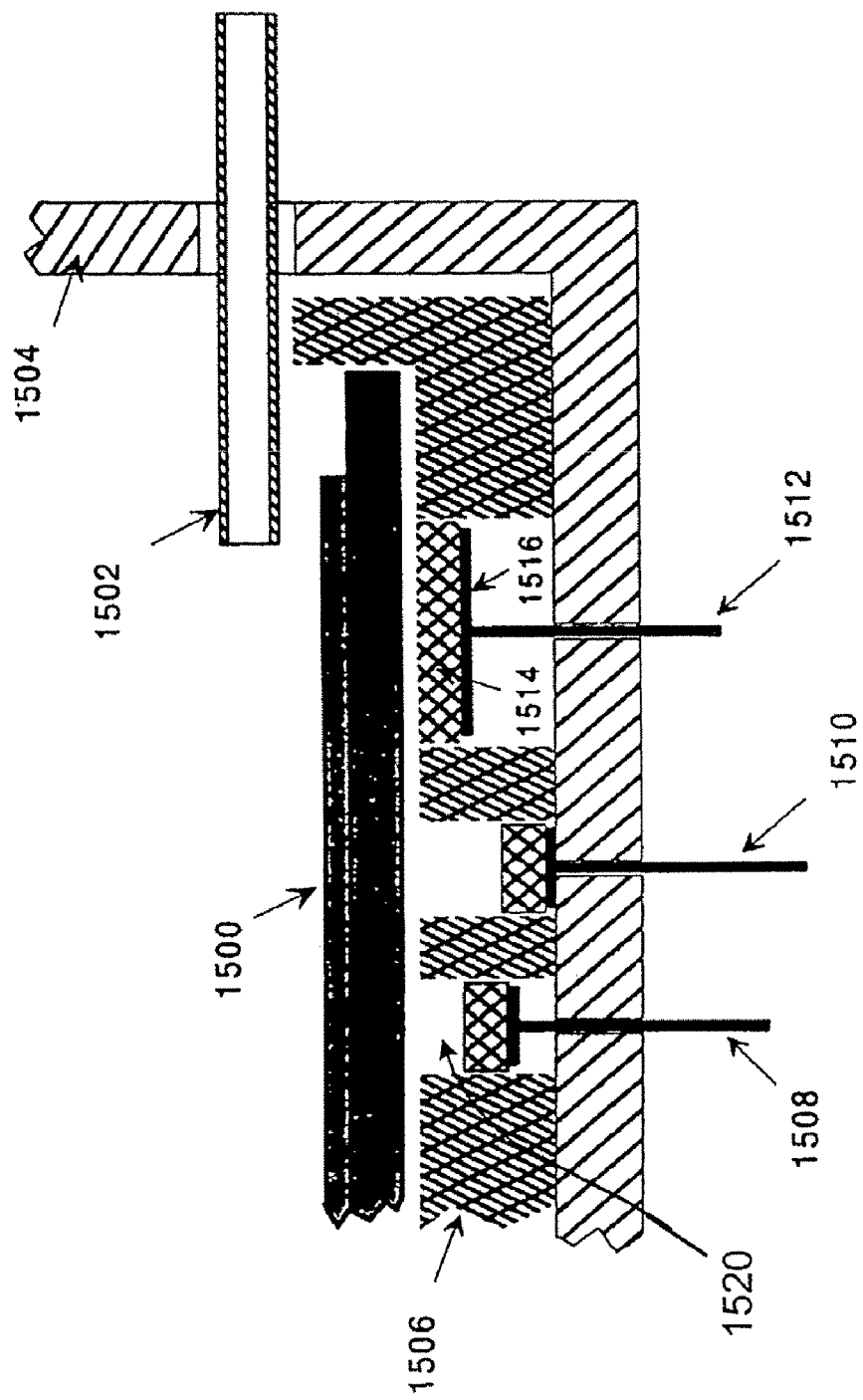

METHOD AND APPARATUS FOR CRYSTAL GROWTH

CROSS-REFERENCE TO RELATED APPLICATIONS

This application is a divisional of application Ser. No. 10/688,864, filed on Oct. 17, 2003, now U.S. Pat. No. 7,407,550, which claims the benefit of and priority to U.S. provisional patent application Ser. No. 60/419,769, filed on Oct. 18, 2002, the entire disclosures of which are both herein incorporated by reference.

GOVERNMENT RIGHTS

The subject matter described herein was supported in part by NIST Advanced Technology Program, Contract No. 70 NANB0H3028. The U.S. Government has certain rights in this invention.

TECHNICAL FIELD

The invention generally relates to growing crystalline or polycrystalline materials. More particularly, the invention relates to methods and apparatus for growing crystalline or polycrystalline silicon sheet material for use in making low cost solar cells.

BACKGROUND OF THE INVENTION

Silicon sheet material or ribbon is particularly important in making low cost solar cells. Continuous growth of silicon ribbon obviates the need for slicing of bulk produced silicon. Methods for doing this are described in U.S. Pat. Nos. 4,594,229; 4,627,887; 4,661,200; 4,689,109; 6,090,199; 6,200,383; and 6,217,649, the disclosures of which are herein incorporated by reference in their entireties. In these patents, continuous silicon ribbon growth is carried out by introducing two high temperature material strings up through a crucible that includes a shallow layer of molten silicon. The strings serve to stabilize the edges of the growing ribbon and the molten silicon freezes into a solid ribbon just above the molten layer. The molten layer that forms between the strings and the growing ribbon is defined by the meniscus of the molten silicon. U.S. Pat. Nos. 6,090,199 and 6,217,649 describe a method and apparatus for continuous replenishment of the feedstock material in a continuous silicon ribbon.

In order to produce lower cost solar cells and hence expand large-scale electrical applications of solar electricity, it is important to have lower cost and higher quality substrate materials for making the solar cell. The current invention provides new and improved methods and apparatus for growing silicon ribbons.

SUMMARY OF THE INVENTION

The invention, in one embodiment, relates to a method and apparatus of growing or pulling a crystalline or poly-crystalline sheet material or ribbon from a melt, wherein the melt is retained by capillary attachment to edge features of a mesa crucible. In a preferred embodiment, the invention is practiced with string ribbon or edge-stabilized ribbon wherein strings or fibers are used to stabilize the edges of the ribbon by capillary attachment. This method allows for the growth of ribbons, including continuous ribbons, directly from the surface of the melt. The melt may be of infinite extent in directions perpendicular to the growth direction of the ribbon, which is the location of the ribbon defined by the location of the strings.

In one aspect, the invention provides a method of forming a crystalline ribbon. The method includes providing a mesa crucible having a top surface and edges defining a boundary of the top surface of the mesa crucible and forming a melt of a source material on the top surface of the mesa crucible. The edges of the melt are retained by capillary attachment to the edges of the mesa crucible. A crystalline ribbon is pulled from the melt. In various embodiments. the pulling step includes placing a seed in the melt and pulling the seed from the melt between a pair of strings positioned along the edges of the crystalline ribbon. The melt is solidified between the pair of strings to form the crystalline ribbon, and the crystalline ribbon is continuously pulled from the melt.

In one embodiment, at least a portion of a boundary profile of the melt is concave downward prior to the pulling step. At least a portion of the boundary profile of the melt may be concave downward outside the region of the crystalline ribbon as well. In one embodiment, pulling the crystalline ribbon from the melt forms an inflection point in a cross-sectional boundary profile of the melt. In some embodiments, the method includes forming a substantial portion of the melt above the edges of the mesa crucible. The inflection point in at least a portion of the cross-sectional boundary profile of the melt predisposes the crystalline ribbon to grow substantially flat.

In various embodiments, more than one crystalline ribbon may be formed. The method may include replenishing the source material on the top surface of the mesa crucible for continuous crystalline ribbon growth. In some embodiments, the temperature of the mesa crucible is controlled while forming the crystalline ribbon.

In another aspect, the invention provides an apparatus for forming a crystalline ribbon. The apparatus includes a mesa crucible having edges defining a boundary of a top surface of the mesa crucible. The mesa crucible retains edges of a melt by capillary attachment to the edges of the mesa crucible. In some embodiments, a pair of strings is positioned along the edges of the crystalline ribbon. The pair of strings define a region within which a crystalline ribbon is formed. The mesa crucible may be graphite. In some embodiments, the edges of the mesa crucible define a recessed top surface of the mesa crucible. The width of the mesa crucible may be between about 15 mm and about 30 mm.

In yet another aspect, the invention provides a method of forming a crystalline ribbon. The method includes providing a crucible having a top surface and edges defining a boundary of the top surface of the crucible. A melt of a source material is formed on the top surface of the crucible, and a crystalline ribbon is pulled from the melt. The crucible may be a mesa crucible. In various embodiments, the melt has a boundary profile at least a portion of which is concave downward. In some embodiments, pulling a crystalline ribbon from the melt forms an inflection point in at least a portion of a cross-sectional boundary profile of the melt. A substantial portion of the melt may be above the edges of the crucible.

In another aspect, the invention provides a method of controlling temperature of a mesa crucible while forming a crystalline ribbon. The method includes positioning an insulator comprising movable elements along a mesa crucible and disposing the mesa crucible in a furnace. Controlled heat leaks are created by moving the moveable elements of the insulator relative to the mesa crucible.

In still another aspect, the invention provides an apparatus for controlling temperature of a mesa crucible while forming a crystalline ribbon. The apparatus includes a mesa crucible disposed within a furnace, and an insulator comprising movable elements disposed along the mesa crucible. The apparatus also includes means for moving the moveable elements of the insulator relative to the mesa crucible to create controlled heats leaks.

In another aspect, the invention provides a method of replenishing a melt of a source material on a mesa crucible. The method includes distributing a source material onto a mesa crucible, thereby reducing the heat load required to melt the source material.

In one embodiment, the distributing step includes positioning a feeder at a distance from a mesa crucible and moving a feeder in a first direction and a second direction along a mesa crucible. The feeder is vibrated during motion in at least one of the first direction and the second direction, such that a source material disposed within the feeder enters a melt on the mesa crucible during such motion. The method may include melting the source material prior to source material from a subsequent motion in the first direction reaching the melt. In various embodiments, the distance from the mesa crucible is less than the width of the mesa crucible.

In yet another aspect, the invention provides an apparatus for replenishing a melt of a source material on a mesa crucible. The apparatus includes means for distributing a source material onto a mesa crucible, thereby reducing the heat load required to melt the source material.

Other aspects and advantages of the invention will become apparent from the following drawings, detailed description, and claims, all of which illustrate the principles of the invention, by way of example only.

BRIEF DESCRIPTION OF DRAWINGS

The advantages of the invention described above, together with further advantages, may be better understood by referring to the following description taken in conjunction with the accompanying drawings. In the drawings, like reference characters generally refer to the same parts throughout the different views. The drawings are not necessarily to scale, emphasis instead generally being placed upon illustrating the principles of the invention.

FIG. 7A-7C show exemplary embodiments of a melt pool on top of a mesa crucible.

FIG. 9A-9D show four examples of the shape of the meniscus from growth of ribbon from a mesa crucible.

FIG. 13 depicts an apparatus that minimizes mechanical and thermal disturbance to a system while replenishing a melt on a mesa crucible.

FIG. 14 depicts an apparatus for controlling the temperature of a mesa crucible.

DETAILED DESCRIPTION OF THE INVENTION

The invention, in one embodiment, relates to a method of growing crystalline or poly-crystalline sheet material. As used herein, the term crystalline refers to single crystal, poly-crystalline and semi-crystalline materials. In a preferred embodiment, the invention is practiced with string ribbon or edge-stabilized ribbon wherein strings or fibers are used to stabilize the edges of the ribbon by capillary attachment. This method allows for the growth of ribbons, including continuous ribbons, directly from the surface of the melt. The melt may be of infinite extent in directions perpendicular to the growth direction of the ribbon, which is the location of the ribbon defined by the location of the strings. The invention is described in reference to silicon, although other materials may be used. Other materials include germanium, alloys of silicon, and alloys of germanium, and generally those materials that can be produced by crystal growth from the liquid.

In an existing technique for crystal growth, a crucible with walls is used to contain the molten material. When a large crucible is used, the walls of the crucible are far from the growing ribbon, and thus the ribbon behaves as though it were growing from an infinitely large pool of melt. However, as the size of the crucible is reduced in order to reduce the cost of the process, the walls of the crucible come closer to the growing ribbon, resulting in an effect which causes the ribbon to grow in a non-flat or trough-like configuration. Such non-flat growth can also result from other factors such as a direction of pulling or withdrawal of the ribbon which is not precisely perpendicular to the surface of the melt.

The present invention, in one embodiment, provides a means alternative to a conventional crucible for confining and defining the location of the melt from which the string ribbon is grown. This means is comprised of defining the edges of the pool of melt by capillary attachment to edge features of a wetted, or partially wetted material, with a substantial portion of the volume of the melt positioned above these edges. The shape of the surface of the melt on top of this "mesa" crucible without ribbon present is characteristically concave downward, in contrast to the characteristically concave upward shape of the melt surface in a conventional crucible with walls without ribbon present. Regions outside the ribbon may also be concave-downward as well. In addition, as will be described in more detail below, an inflection point is formed in a cross-section of the boundary profile of the melt. This inflection point creates an effect that pre-disposes the ribbon to grow flat.

Figure 11:
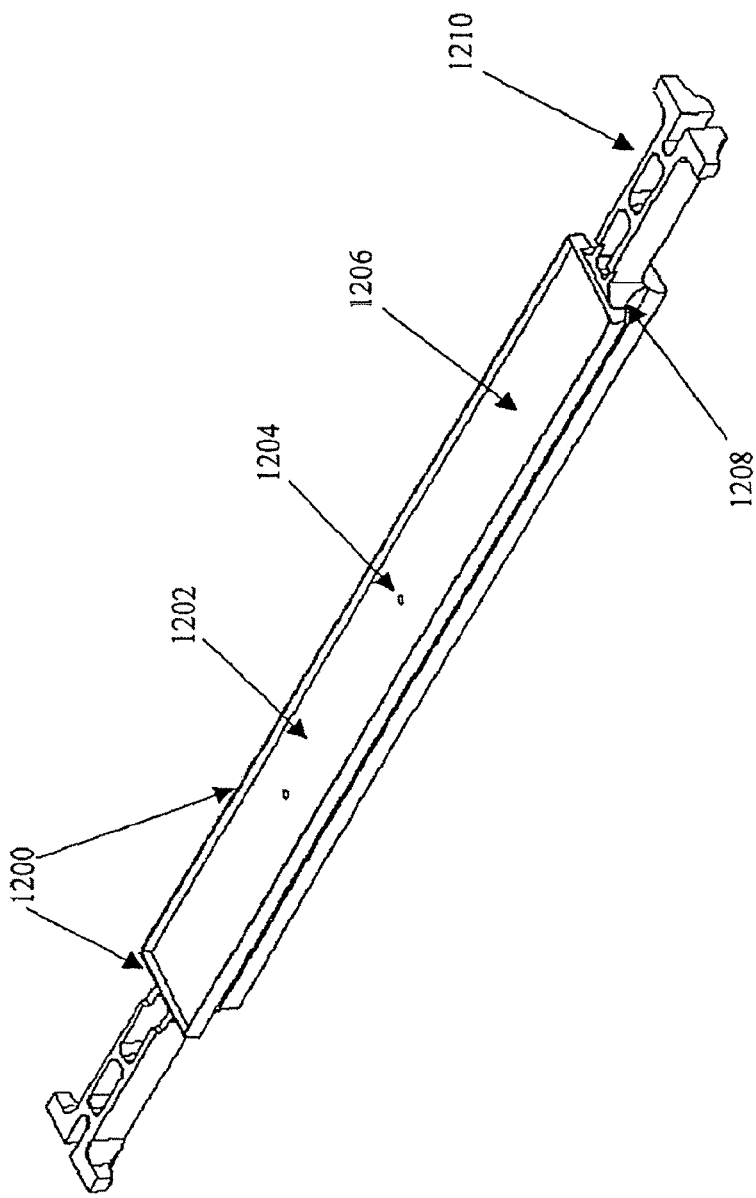
FIG. 11 shows a mesa crucible in isometric view.

This effect is essentially the opposite of the effect that takes place because of the walls of a conventional crucible, wherein the ribbon is predisposed to grow in a non-flat shape. The predisposition of the ribbon to grow flat due to the concave down shape can also mitigate factors such as off-axis pulling which tends to create a non-flat ribbon. As used herein, the term "mesa" refers to a crucible which has the general form of a mesa—a generally flat top surface and steep side walls. In the case of the mesa crucible, a surface is defined by the edges of the mesa. In the preferred embodiment this surface is planar. In some embodiments, the edges of the mesa are curved or undulating. Such curvature shapes the meniscus across the width of the ribbon, may influence the nature of and propagation of grain, structure, and stress in the ribbon. Note that the surface of the crucible itself can have a slight depression, e.g., on the order of about 1 mm, as shown in FIG. 11. However, there is still a plane defined by the top edges of the mesa. In the case of a slight depression, or raised edges, the raised edges may have a land.

When growing crystal ribbons from a mesa crucible, the meniscus shape is self-stabilizing, in that the growing ribbon moves back to the center in response to any perturbation. Another advantage is that the base edge of the meniscus is reasonably far from the interface between liquid and solid. This is helpful because particles can grow at the base of the meniscus where it attaches to a crucible. During the growth of a crystalline ribbon in a crucible made of graphite (the preferred practice), silicon carbide particles can grow, and if any oxygen is present, silicon oxide particles can grow. These particles can disturb the flatness and structure of the growing crystals and can even interrupt the growth. As the base edge of the meniscus is reasonably from the growth interface when using a mesa crucible, the impact of such particles is minimized.

As a consequence of this concave down melt surface shape and its effect of leading to the growth of flat ribbon, the edges of the melt pool may be brought into close proximity with the ribbon and the size of the melt pool minimized. The small size of the melt pool, in combination with the lack of need for walls of the crucible, leads to a dramatic reduction in the amount of crucible material needed and in the expense associated with machining it into shape. In addition, less power is needed to keep the melt pool and mesa crucible at the proper temperature. These factors result in a reduction in manufacturing cost for the ribbon produced. At the same time, the "flattening" effect induced by the shape of the melt surface, results in flatter, higher quality ribbon. This improved ribbon flatness results in higher yields in the subsequent handling of the ribbon. Another advantage of the mesa crucible approach is that it can be scaled to the growth of multiple ribbons from a single crucible by further elongating the crucible With the conventional practice of string ribbon, the ribbon is grown from a pool of melt that is large enough in horizontal extent that it appears to be infinite in extent to the growing ribbon. In such a case, the meniscus that forms between the melt and the growth interface has a shape which is determined by capillary and the height of this interface above the free melt surface. The curvature is calculated using the Laplace Equation:

$$\Delta P = \gamma \left( \frac{1}{R_1} + \frac{1}{R_2} \right) \quad (1)$$

Where $\Delta P$ is the pressure difference across the interface between liquid and gas (the meniscus surface), $\gamma$ is the surface tension of the liquid, and $R_1$ and $R_2$ are the principal radii of curvature of the meniscus.

The pressure difference across the interface between liquid and gas at a given point on this interface can be found from the height of this point above the "free melt surface." At the free melt surface, the curvature of the liquid/gas interface is zero, and there is no pressure drop across the liquid/gas interface. As the meniscus is above the free melt surface, the pressure within it is lower than in the gas surrounding it. The pressure difference across the interface between liquid and gas at a height y above the free melt surface is given by:

$$\Delta P = \rho g y \quad (2)$$

Where g is the acceleration of gravity, and $\rho$ is the density of molten silicon.

Figure 1:
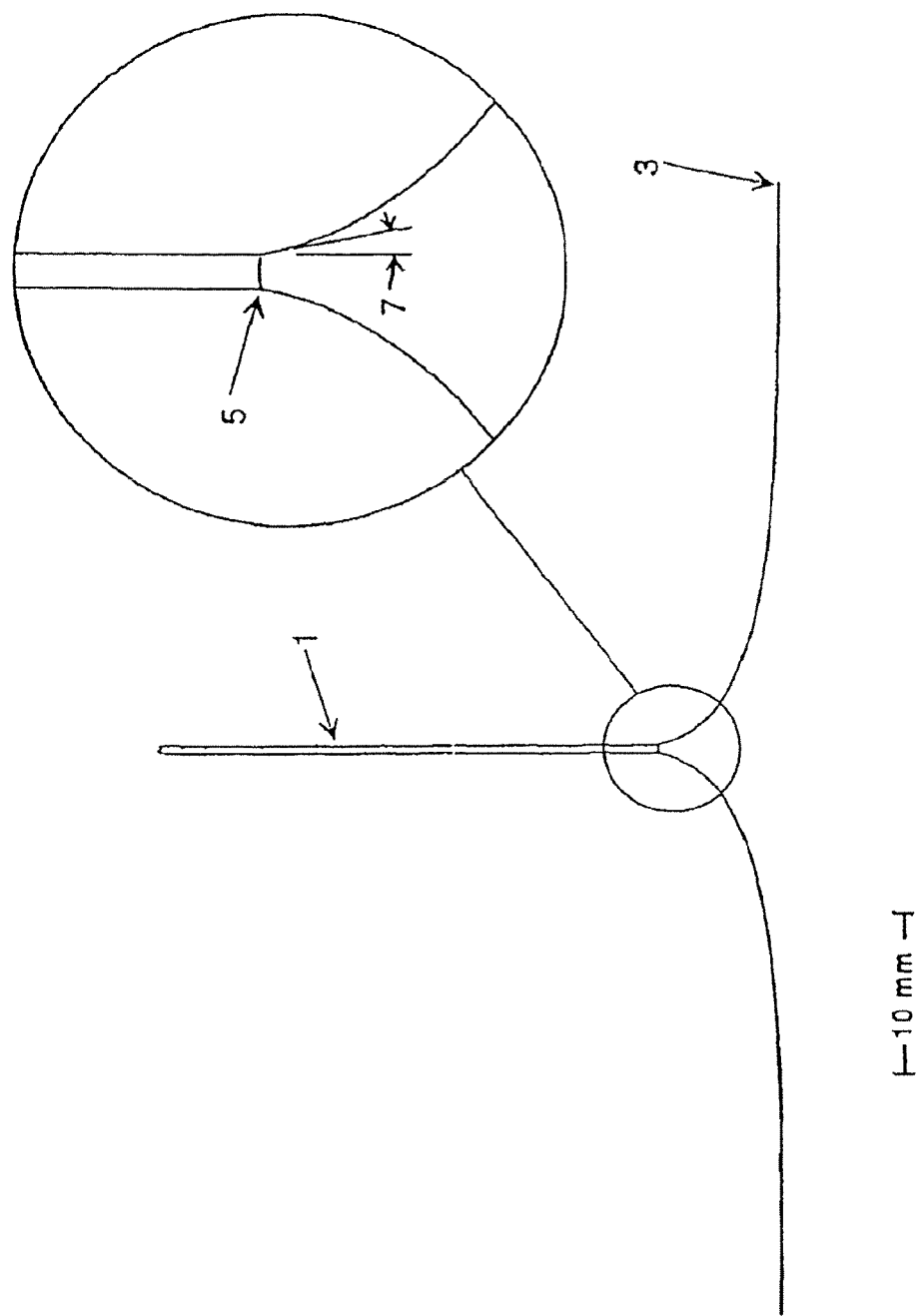
FIG. 1 shows a flat ribbon growing perpendicularly from a free melt surface.

FIG. 1 shows a flat ribbon 1 growing perpendicularly from a free melt surface 3. The drawing is roughly to scale and the ribbon is 500 microns. This is thicker than a typical ribbon, which might range from about 200-300 microns thick, but the higher value is used to aid in illustration. Further, the concept can be used over a wide range, including the growth of thin ribbon of 30-100 micron thickness as might be useful for lower cost, higher efficiency and/or flexible solar cells. For the case of a flat ribbon, one of the principal radii of curvature of equation (1) is infinite (for example, $R_2$ is taken to be infinite). A numerical calculation may be done using a technique such as the Finite Difference method, to calculate the curvature of the meniscus at each point along its surface, and integrate the resulting shape. This calculation can be conveniently started at the interface 5 between solid and liquid silicon using as an initial position the known equilibrium angle 7 between the solid and liquid silicon at the growth interface of 11°. A guess is made as to where the interface is and the numerical calculation produces the shape of the meniscus. The guess is refined until the proper boundary condition is met at the surface of the melt—that is that the meniscus reaches the height of the pre-melt surface with a slope of 0 (horizontal). By using such a technique, it can be found that at the center of a wide silicon ribbon, the height of the interface above the melt surface is approximately 7.10 mm. FIG. 1 is a scale drawing of the shape of the meniscus calculated by such a finite difference method.

Figure 2:
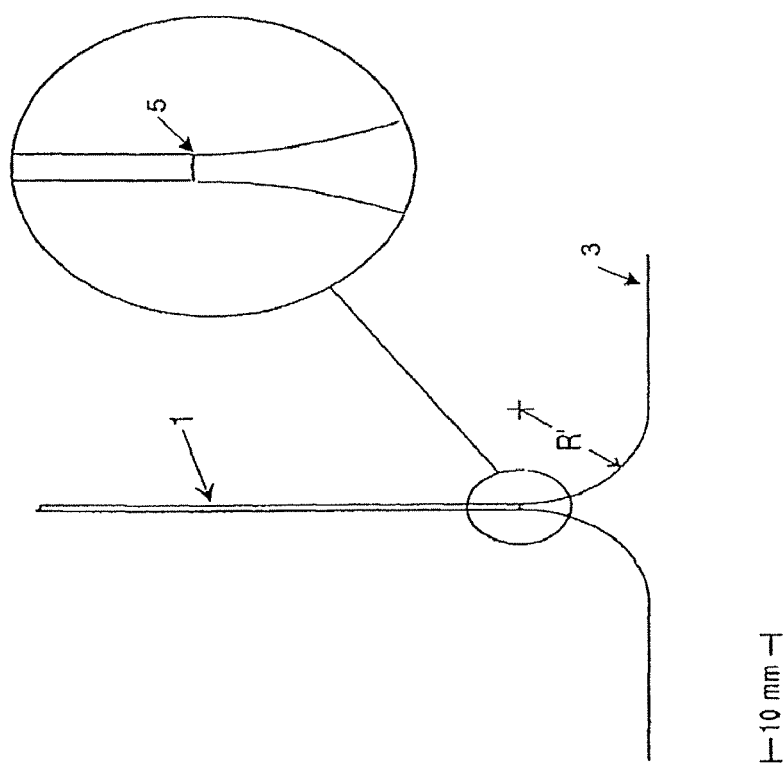
FIG. 2 shows the constant curvature approximation for the meniscus height.

Alternatively, an approximate method can be employed wherein the curvature of the meniscus is assumed to be constant and have a value of R' (and not be a function of the height above the free melt surface). A further approximation is made that the equilibrium angle between solid and liquid silicon is 0°. Thus, the height of the meniscus will be equal to the magnitude of the radius of curvature of the meniscus, R', as illustrated in FIG. 2 (again for the case of a ribbon of thickness 500 microns). A final approximation takes the pressure drop across the liquid/gas interface to be equal to that present at half the height of the meniscus. Substituting a value of R'/2 for y in equation 2, we find that $\Delta P = /\rho g\ R'/2$ (the pressure within the meniscus is lower than outside the meniscus). Substituting this value of $\Delta P$ and a value of R'/2 for $R_1$ in equation 1 we obtain:

$$\frac{\rho g R'}{2} \approx \frac{\gamma}{R'} \quad (3)$$

Re-arranging equation 3 and using s to represent the meniscus height, we obtain:

$$s \big|_{center\ of\ vetical\ ribbon;approx.\ analysis} = \quad (4)$$
$$R' \approx \sqrt{2}\ \sqrt{\frac{\gamma}{\rho g}} = \sqrt{2}\ \sqrt{\alpha}$$

Where $\alpha$ is defined as $\gamma/\rho g$, for convenience.

Substituting values of $\gamma=0.7$ N/m, $\rho=2300$ kg/m$^3$, and 9.8 m/sec$^2$ for the acceleration of gravity, g for molten silicon, we find that this approximate analysis produces a meniscus height of 7.88 mm. Thus, the approximate analysis produces a result fairly close to that of the numerical analysis. These two methods will be used with modification to describe the current invention below.

During growth, string ribbon can be subject to some influences that lead to growth conditions, which are less than ideal. For example, if the device pulling the ribbon (the "puller") is located at a position slightly displaced from directly above the region where the ribbon grows, the ribbon will be pulled at a slight angle with respect to the melt.

Figure 3:
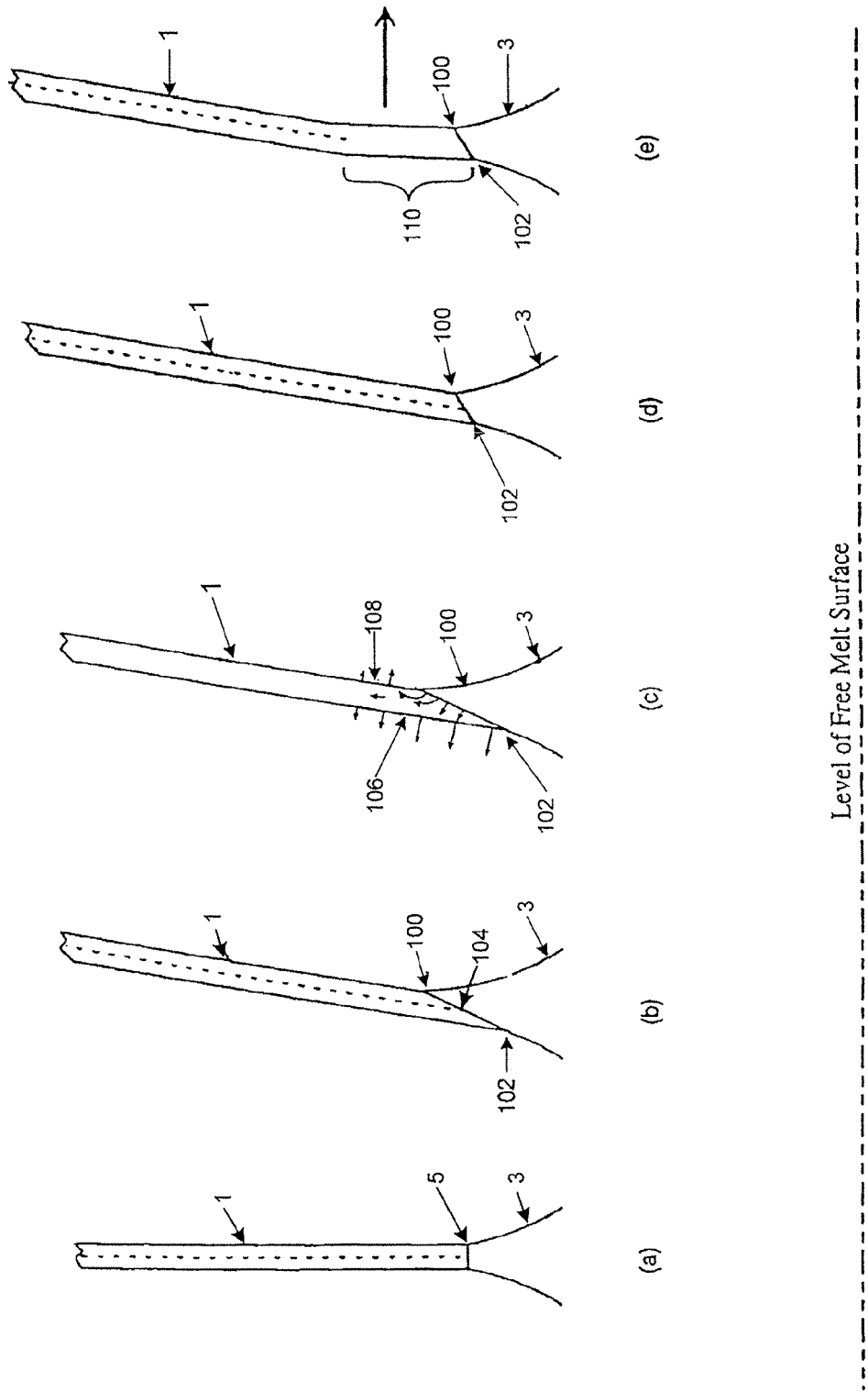
FIG. 3A-3E show how pulling at an angle to the melt results in changes to the height of the interface.

FIG. 3 shows a series of drawings depicting a close-up of the upper region of the meniscus, the lower region of the growing ribbon and the interface between liquid and solid. The drawings are approximately to scale for silicon ribbon growing from a melt surface. The scale of the drawings is approximately 10:1 (the drawings are shown approximately 10× larger than actual size) with a ribbon thickness of 0.5 mm. The position of the free melt surface is shown in FIG. 3, although the scale of the drawing does not allow for the menisci to be drawn all the way down to this level without many lines crossing over each other and rendering the drawing difficult to interpret.

In FIG. 3a the ribbon 1 is shown growing vertically from the melt 3, much as in FIG. 1. FIG. 3b shows the ribbon as it grows when pulled at an angle of 10 degrees from the vertical, with consideration of only the physics governing the shape of the meniscus and its interface to the growing ribbon. Note that 10 degrees is an extreme angle—much larger than an angle that might be encountered due to a misaligned puller and is chosen for purposes of illustration. Not considered in FIG. 3b are the heat transfer considerations discussed below. These heat transfer considerations will force the ribbon to grow differently than shown in FIG. 3b. Note that in FIG. 3b, the meniscus height 100 on the "underside" is higher than the meniscus height 102 on the "topside." The origin of this difference in height is that on the "underside" the meniscus must be allowed to reach a greater height in order to curve over and meet the ribbon at the thermodynamically determined angle at the interface. The result is that the interface between liquid and solid 104 is inclined at a steep angle with respect to the ribbon. This situation can be modeled by the integration of the Laplace equation, as discussed above, but this time the initial angle conditions have changed. Thus, if the ribbon is being pulled at an angle of 10° from the vertical, the angle of the meniscus surface on the "underside" meniscus is an angle of 1° from the vertical where the meniscus meets the ribbon (the equilibrium solid-liquid angle of 11 degrees—the pulling angle of 10 degrees). The angle of meniscus surface for the "topside" meniscus is an angle of 21° from the vertical where the meniscus meets the ribbon (the equilibrium solid-liquid angle of 11 degrees+the pulling angle of 10 degrees). The change in meniscus height due to pulling at an angle from the vertical may be related to the pulling angle as follows:

$$\Delta s = r\theta = \frac{\gamma}{\rho g s} \theta \quad (5)$$

Where $\Delta s$ is the change in meniscus height from the value when pulling vertical ribbon, r is the radius of curvature at the top of the meniscus and $\theta$ is the angle of pulling, measured from the vertical. The radius of curvature of the meniscus at the top of the meniscus is found from the Laplace equation at a height s above the free melt surface ($r=\gamma/\rho g s$). In this approximate result, the equilibrium angle of 11° between solid and liquid silicon is ignored. For the case of pulling at 10 degrees from the vertical, equation 5 gives $\Delta s$=0.78 mm. Thus, the meniscus on the "underside" is higher by 0.78 mm than the meniscus for vertical ribbon, while the meniscus on the "topside" is 0.78 mm lower than the meniscus for vertical ribbon. A very similar result may be obtained using the finite difference numerical approach described above, starting with different boundary conditions for the angle of meniscus at the top of the meniscus.

However, as noted above, heat transfer considerations will not allow the situation of FIG. 3b to persist. Note that FIG. 3c shows the direction and approximate magnitudes of the heat fluxes up the ribbon and out its surfaces. Note that there is a significant flux from the interface to the "topside" 106 of the ribbon (there must be, as the interface is, by definition, at the melting point of silicon and the surface of the ribbon is cooler). However, since the two sides of the ribbon lose approximately the same amount of heat to the environment (the inclination of the ribbon may allow the topside to loose a bit more heat, but not much), there is no way that the higher heat fluxes moving from the interface to the top surface of the ribbon can be supported. As a consequence, the extra heat arriving at the top surface will tend to melt the ribbon back, leading to an increase of the meniscus height at the topside of the ribbon. An analogous argument leads to the conclusion that the ribbon on the underside 108 will be caused to temporarily grow faster than in the case of vertically pulled ribbon, leading to a decrease in the height of the meniscus on the underside of the ribbon, as follows. The inclination of the interface of FIG. 3b leads to heat being conducted toward the topside of the ribbon. Less heat is directed toward the underside of the ribbon than for vertical growth of ribbons. The ribbon will therefore solidify faster on this side and the meniscus height will decrease. An this manner, thermal considerations force the meniscus to look more like that shown in FIG. 3d where the meniscus heights are closer to equal on top and bottom sides, as compared with the situation of FIG. 3c. However, the situation of FIG. 3d cannot persist as the equilibrium requirements of the angle of the melt with respect to the growing solid is not satisfied.

The meniscus of FIG. 3d forces the ribbon to grow at an angle different from that of the pulling direction for a transient period. The direction of growth is determined by a chain of effects. Laplace's equation determines the shape of the meniscus. Thermal conditions influence the height of the meniscus. The height in combination with the shape determines the angle of the meniscus at its top (where it meets the solid silicon). The liquid and solid silicon must maintain the equilibrium angle of 11 degrees at the interface. The angle of the ribbon surface is thus determined. FIG. 3e shows the pulling direction as a dotted line and shows the ribbon 110 growing at less of an angle with respect to the vertical (less than the angle of the pulling direction). As a consequence, the ribbon advances over the surface of the melt in the direction of the arrow shown in FIG. 3e. This growth is toward the side of the ribbon that has the higher meniscus. This is a general result applicable to situations other than pulling a ribbon at an angle to the melt. The result is that any situation that tends to cause the meniscus on one side of the ribbon to be higher than the meniscus on the other side, will result in the ribbon growing in a direction determined by the higher meniscus height.

Figure 4:
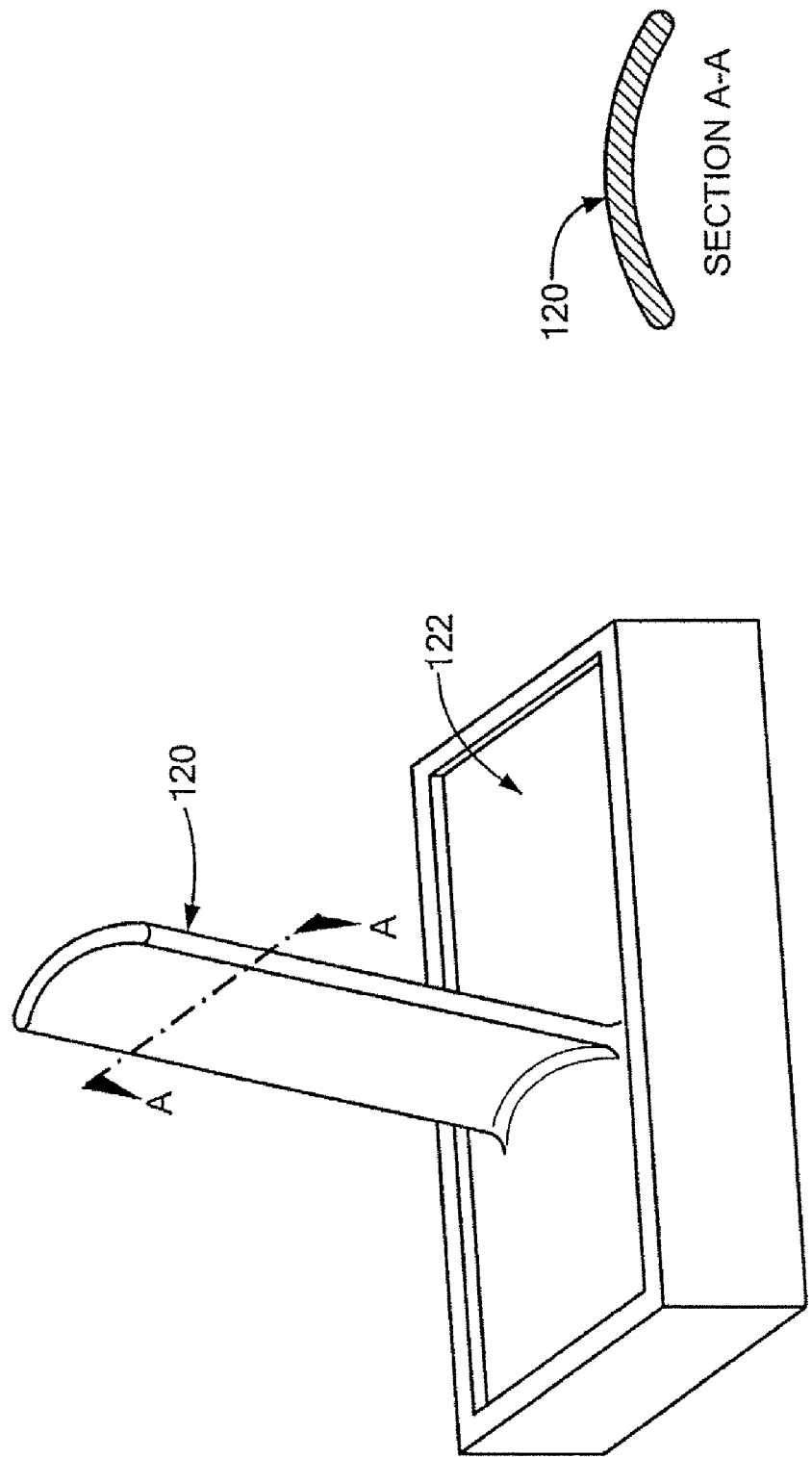
FIG. 4 shows a 3-D view of a ribbon growing in a trough shape from the surface of a melt.

In the case of the ribbon which is pulled at an angle to the melt, the center portion of the ribbon is now caused to grow in the direction of the ribbon that has the higher meniscus, however, the edges of the ribbon are fixed in place by the location of the strings. As a consequence, the ribbon 120 tends to grow in the shape of a trough from the melt 122 as illustrated in FIG. 4. For small angles of pulling from the vertical, an equilibrium trough shape will be reached and maintained. The equilibrium trough shape arises from the fact that the troughing itself changes the meniscus height on the two sides of the ribbon. The curvatures of the surface of the meniscus must at all points obey Laplace's equation, equation 1. As noted previously, in the case of a flat ribbon, one of the principal radii of curvature, $R_2$, is infinite in extent, and therefore drops out of Equation 1. However, when the ribbon grows as a trough, the concave side of the ribbon (the topside in FIG. 4) now has a finite value of $R_2$, and it is of the same sign as $R_1$. As a consequence, $R_1$ must increase (in magnitude) from the value it has for a flat ribbon. On the convex side of the ribbon, i.e., the underside in FIG. 4, the troughing results in a finite value of $R_2$, but one that is of sign opposite to $R_1$. As a consequence, $R_1$ must assume a value smaller in magnitude than that for a flat ribbon. The result is that the troughing results in a shorter meniscus on the convex side (corresponding to the underside of a ribbon pulled at an angle to the melt), and a higher meniscus on the concave side (corresponding to the topside of a ribbon pulled at an angle to the melt). The changes in meniscus height due to troughing result in changes in meniscus height, which counteract the effect of pulling at an angle.

The constant curvature approximate method used to arrive at the approximation of Equations 3 and 4 can be extended to the case of troughing. In this derivation, the ribbon will be examined in a snapshot where it is growing vertically from the surface of the melt, but with a trough. While such a situation will not persist, the relationship between troughing and meniscus height will be easiest to analyze for this case. As in the derivation of equation 3, R' is the radius of curvature of the meniscus in the vertical plane. For convenience, R', which is concave, is taken to be positive in value. In this case, R* is the radius of curvature of the trough (which can assume both positive and negative values). Again, the pressure drop across the meniscus is taken to be that at half the meniscus height. Further, under the approximation that the liquid meets the solid with no discontinuity in angle, the meniscus height is equal to R'. Thus, $$\frac{\rho g R}{2} \approx \gamma \left( \frac{1}{R'} + \frac{1}{R^*} \right) \tag{6}$$

Solving for R' and equating to the meniscus height we get:

$$s = \sqrt{2\alpha} + \frac{\alpha}{R^*} \tag{7}$$

The first term in equation 7 is the meniscus height for the case of vertical ribbon growth. The second term is the change in meniscus height due to troughing. As noted above, the concave side of the trough (positive value of R*) experiences an increase in meniscus height, while the convex side experiences a decrease in meniscus height. This problem may also be treated by the numerical method, and these predictions match the approximate results of Equation 7 with good accuracy.

The growth of the ribbon in the shape of a trough is a response to pulling off-angle and can lead to a stable growth situation for small angles of pulling. The chain of events begins by pulling at an angle to the vertical. This alters the shape of meniscus. However, thermal effects enter and cause the ribbon to grow in the direction of the higher meniscus. The center of the ribbon can move, but the edges cannot, and a trough results. The troughing in turn, alters the shape of the meniscus so as to lower the meniscus height on the underside of the ribbon and raise it on the topside—the exact opposite of the effect of pulling an angle from the vertical. If the angle of pulling is small (close to the vertical), the trough may be sufficient to completely counteract the effect of pulling off-angle and result in meniscus heights that are approximately equal on the two sides of the ribbon.

Figure 5:
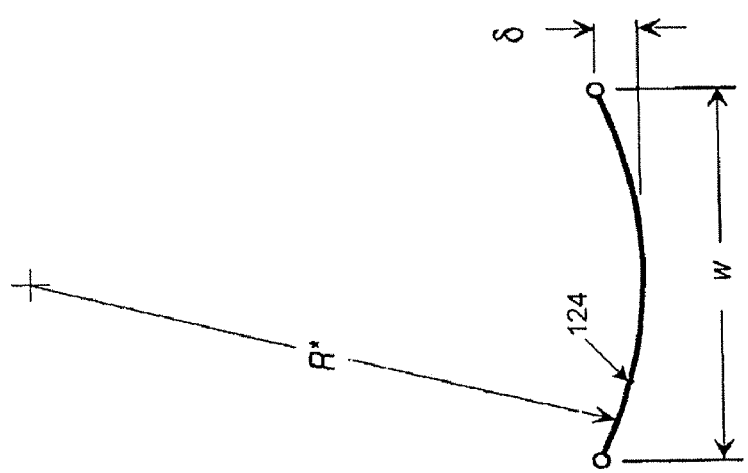
FIG. 5 shows the relationship between the width of a ribbon, the radius of its trough and the depth of the trough.

For a ribbon 124 of width w, we can relate the troughing radius, R*, to the depth of the trough, $\delta$, as illustrated in FIG. 5 (which shows a vertical view of a cross-section through the ribbon) as follows:

$$\delta \cong \frac{w^2}{8R^*} \tag{8}$$

As an example, if we pull a ribbon at an angle of 1° from the vertical, we can use equation 5 to calculate that meniscus height on the topside of the ribbon will decrease by approximately 78 microns, while that on the bottom of the ribbon will increase by approximately 78 microns. The center of the ribbon will move in the direction of the higher meniscus and the ribbon will grow in the shape of a trough. The trough will deepen until the change in meniscus height predicted by equation 7 counteracts the change predicted by equation 5. The result will be a trough of radius R*=0.4 m. If the width of the ribbon is 60 mm, for example, the depth of the trough may be calculated from equation 8 as 1.1 mm, a significant deviation from flatness. The trough deepens as the ribbon width increases according to equation 8.

In any real system, there will always be some errors or noises in the system resulting, for example, in the ribbon being pulled at a slight angle with respect to the vertical. As can be seen from this discussion, in order to compensate for such disturbances, the ribbon responds by deviating from the desired condition of a flat ribbon. The tendency of the troughing to cause a restoration of flatness may be thought of as something analogous to a restoring force from a spring which is pulled from an equilibrium position. This "restoring" tendency may be quantitatively expressed as the change in meniscus height for one side of the ribbon that is induced by a displacement of the ribbon center from its flat position. Thus, for the case of a trough-shaped growth of the ribbon, this restoring force may be expressed as:

$$\text{Restoring tendency} = \frac{\text{Change in meniscus height on one side}}{\text{Displacement of center}} \tag{9}$$

Using equation 7 in the numerator and equation 8 in the denominator:

$$\text{Restoring Tendency} = \frac{\alpha/R^*}{w^2/8R^*} = \frac{8\alpha}{w^2} \tag{9A}$$

For Silicon ribbon of width w=56 mm, the Restoring tendency from equation 9A has a value of 0.08. Thus for a case where a 56 mm wide ribbon grows in a trough shape with a depth of the trough of 1 mm, the meniscus height on the concave side will rise by 0.08 mm and on the convex side will fall by 0.08 mm. Silicon ribbons with a width of 81.2 mm may also be grown with the result of a lower "Restoring Tendency."

When the ribbon begins to grow in a non-flat configuration, new disturbances may be introduced. For example, when a trough-shaped ribbon enters the pulling device, may exert bending moments on the ribbon resulting in further disturbances to the growth. The analysis presented here is intended to provide understanding about the basic aspects of the process.

It should be understood that prior to the current invention, observations were made relating the axis of the pulling of the ribbon to its tendency to grow in a trough-shaped curve. However, neither the physical mechanisms, nor a quantitative understanding of this phenomenon is known.

In a practical system, it is important to minimize the size of the crucible and the melt pool. Minimizing this size reduces the consumable material used, such as the graphite used for the crucible. Further, the time required to machine the crucible is reduced. Further, the energy required to operate the furnace will be minimized.

Figure 6B:
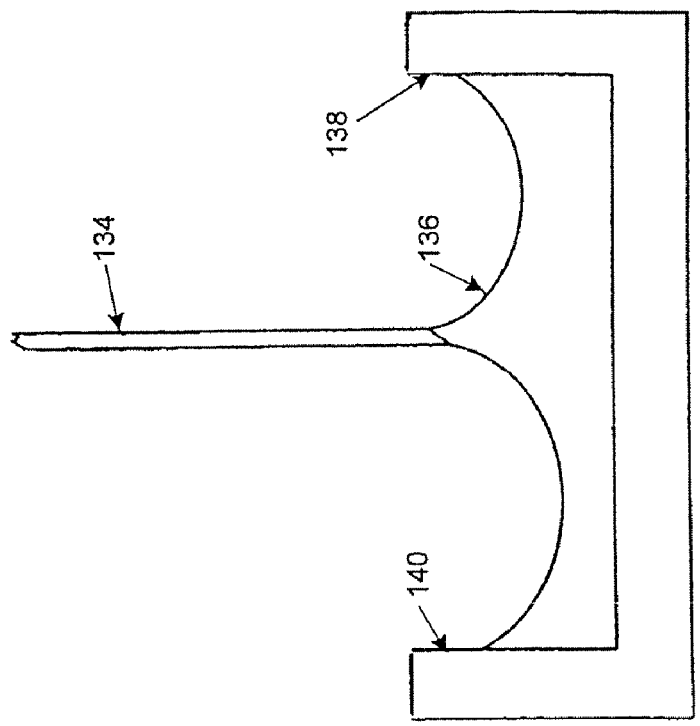
FIG. 6B shows a ribbon growing displaced from the center of a narrow crucible.
Figure 6A:
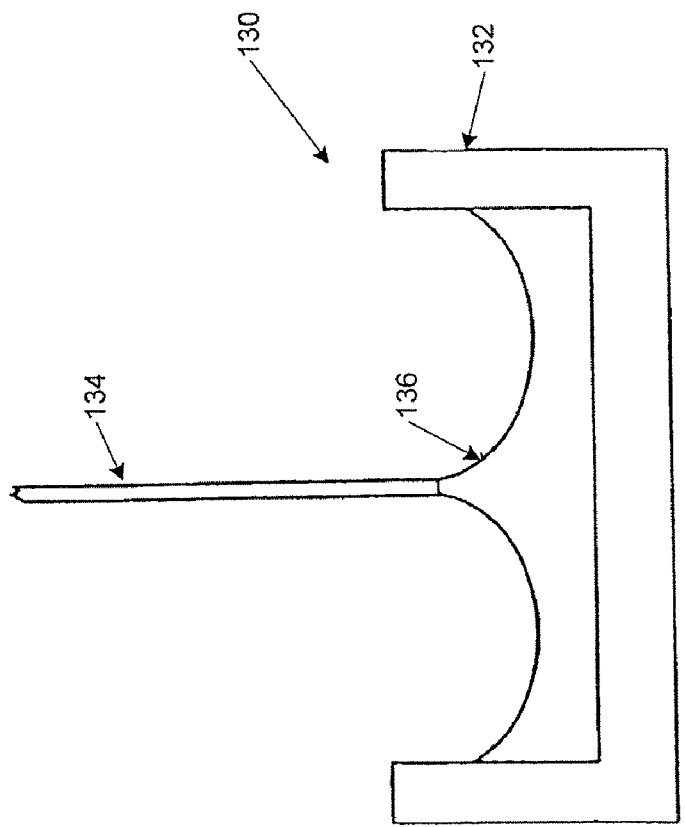
FIG. 6A shows a ribbon growing from the center of a narrow crucible.

The desirable case then is to make the crucible 130 narrower—that is to bring the crucible walls 132 close to the plane of the ribbon 134 being pulled from the melt 136, as illustrated in FIG. 6a. However, this arrangement leads to a situation where the ribbon is less likely to stay flat, or, in the limit, cannot stay flat. FIG. 6b illustrates what happens as the ribbon 134 moves off-center and therefore closer to one wall 138 than to the other wall 140. The boundary condition that is maintained at the wall is that the wetting angle of the meniscus to the wall of the crucible stays constant. In essence, the capillary attachment to the walls of the crucible causes an upward force on the meniscus. As the ribbon gets closer to one wall, this upward force has more effect on this side of the ribbon, resulting in a meniscus height which is higher on that side. The numerical approach described above can be extended to this case. For example, with a crucible that has a separation between walls of 60 mm, if the ribbon moves off center by 1 mm, the difference in the height of the meniscus from one side of the ribbon to the other will be approximately 15 microns. This effect may be expressed with the same sort of ratio used to describe the stabilizing effect of the troughing above. In this case (for reasons discussed below), it is a destabilizing effect which is expressed as the ratio of the change of meniscus height for one side of the ribbon, to the change in the distance of the ribbon to the crucible wall. Table I tabulates this destabilizing effect for different crucible widths. The relevant dimension is the dimension between the ribbon and the inside wall of the crucible.

TABLE I

The destabilizing effect of a Narrow Crucible

| Distance of Ribbon from Wall (mm) | ΔMeniscus Height/ΔDistance |
|---|---|
| 30 | −0.005 |
| 20 | −0.035 |
| 15 | −0.100 |
| 10 | −0.36 |

The effect is a destabilizing effect because, as the ribbon moves toward a wall, the meniscus height on the side of the ribbon closer to that wall increases, while the meniscus height on the side of the ribbon further from the wall decreases. The heat transfer internal to the ribbon causes the ribbon to grow in the direction of the higher meniscus, as described above. This results in the continued growth of the ribbon towards the closer wall. This growth will continue in this direction until reaching the wall. Thus we see that the growth in the configuration of a trough-shaped ribbon is a stabilizing effect, while bringing a crucible wall closer to the plane of the ribbon is a destabilizing effect. Both effects are proportional to the distance that the center of the ribbon moves from the original growth plane, at least for small distances.

If these two effects are equal in magnitude, they will cancel each other, resulting in no predisposition of the ribbon to grow either toward the wall of the crucible or flat. As noted earlier, the Restoring Tendency for a 56 mm wide ribbon is 0.08. Thus, for this ribbon width, the effects will cancel each other at a ribbon-crucible wall value of somewhere between 15 and 20 mm. If the destabilizing effect from a nearby crucible wall is larger, the ribbon will tend to grow into a trough and continue to worsen in flatness. If the stabilizing effect from troughing is larger (corresponding to crucible wall that is far away), the ribbon will, in principle, grow flat. The destabilizing influence of the crucible walls may reduce the ability of the ribbon to reject disturbances such as pulling off the vertical. A 81.2 mm ribbon is grown from a wider crucible for stability.

In summary, bringing crucible walls in towards the plane of the ribbon, while having the potential of improving the economics of the process, has the deleterious effect of leading to ribbon which is less flat.

If the free melt surface (surface of the molten silicon with no ribbon present) is shaped convex-up, it can be shown that a flatness stabilizing effect is produced on the growing ribbon.

In one embodiment, this convex-up or concave-down shape is produced by using a crucible with walls that are non-wetted by the molten silicon. A non-wetting wall is defined as one which has a contact angle greater than 90°. By analogy, a pool of mercury contained in a glass vessel will have a free liquid surface that is convex-up due to the fact that molten mercury does not wet glass. The entire crucible may be made of such non-wetted material, or small pieces of non-wetted material may be inserted into the wall of the crucible where the melt wets the wall. For example in the case of molten silicon, Pyrolitic Boron Nitride can be used as a non-wetted material.

In a preferred embodiment of this invention, the concave-down shape is created by disposing all of or a portion of the melt above the wetted edges and allowing gravity in combination with capillarity to determine the shape of the free melt surface. FIG. 7 shows a cross-section through a flat sheet of wetted material 300 with a pool of molten silicon 302 on top. The wetted sheet is an example of a "mesa" crucible that contains melt on its surface without walls. Rather, the melt is contained by capillarity and is substantially above the wetted edges of the mesa 304. This silicon wets the edges of the sheet while the shape of the melt is determined by capillary action in the presence of the gravity field. The outside walls of the mesa crucible can be vertical as shown in FIG. 7a or can be disposed at a different angle as shown in FIG. 7b. A re-entrant angle such as that shown in FIG. 7b provides for greater resistance to the melt spilling over the side of the crucible, but may be less convenient for fabrication and somewhat less durable. A shallower angle is also possible, but is less resistant to melt spilling than even the vertical side walls. The edge of the meniscus is stable over a wide range of melt heights and melt volumes in part due to the ability of the meniscus to assume a wide range of angles at the edge of the mesa, as is also shown in FIG. 9, which is described below. FIG. 7c. shows a detail of one edge of the mesa crucible of FIG. 7a. Note that the edge need not be a perfectly abrupt angle, but rather can have a radius as in FIG. 7c. In fact, in general the crucible will have such a radius, even if machined as a "hard" angle—albeit at a small scale. Further, if it is found to be advantageous for manufacturing cost or durability, a radius can be deliberately machined into the crucible. The spot or location of the meniscus on the radius is determined by satisfying the wetting angle condition between the liquid and the material of the crucible. In the case of FIG. 7c, this angle is approximately 30 degrees—a typical angle for a wetting system.

Figure 12:
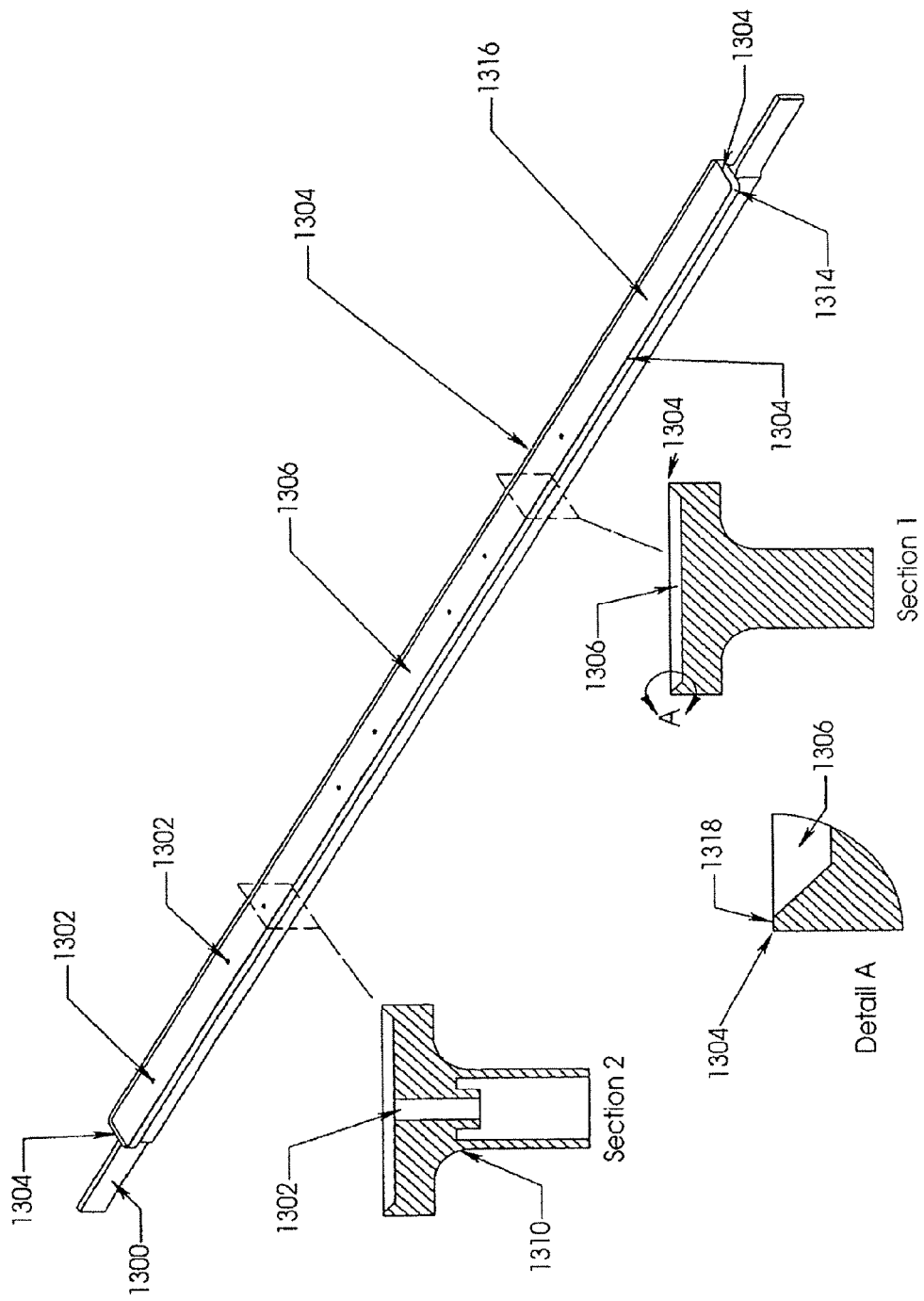
FIG. 12 shows an isometric view of a graphite mesa crucible suitable for growth of multiple ribbons.

The Finite Difference numerical method of calculating the meniscus shape, as described above, may be extended to calculate the shape of the free melt surface on this mesa crucible in the absence of a ribbon. For a given width of mesa, a height of melt at the center of the mesa is assumed. This height is measured from the plane defined by the edges of the mesa. Next, a guess is made as to radius of curvature of the melt at the top center of the mesa. The shape of the melt is then calculated. Iteration is performed until the melt passes through the edge of the mesa. For example, if the radius at the top center is assumed too large, the first iteration will produce a result where the melt surface passes over the edge. A second iteration can then be done with a smaller radius of curvature. There is no need to match a particular angle at the point where the meniscus intercepts the edge of the mesa as the liquid can assume a wide range of angles at this point. Indeed, this is part of what makes the mesa crucible stable over a wide range of conditions. This type of analysis can be repeated with different widths of mesa and different heights of melt. The pool of melt atop the mesa may be stable for a wide range of melt height. The limits to stability stem from the angle of wetting of the liquid at the edge of the mesa. If the melt pool is too shallow, the angle of wetting may be smaller than the equilibrium wetting angle on the mesa material, and the pool may shrink in away from the edge. In FIGS. 11 and 12, both described below in more detail, a recess is created in the crucible, which substantially reduces this danger. If the pool is too deep, the wall of the pool will exceed the vertical at the edge, and be prone to instability. Although in principal the wall of the pool may somewhat exceed the vertical at the edge (for example, in FIG. 7b), this is not the preferred embodiment. For example, for a mesa with a total width of 60 mm (30 mm from each face of the ribbon), the mesa will hold silicon until the silicon reaches a height of approximately 8 mm above the plane defined by the edges of the mesa. For a mesa with a total width of 20 mm, the mesa will hold silicon until the silicon reaches a height of approximately 6 mm above the plane defined by the edges of the mesa. FIG. 7 shows the shape of the pool of molten silicon on a mesa of total width 20 mm in a case where the height of the melt at the center is 5 mm.

Table II shows tabulations for two mesa widths and two heights of melt. For each of the four combinations, four calculations are tabulated. "Angle" refers to the angle of the meniscus where it meets the edge of the mesa, measured from the horizontal. "Radius of Curvature" refers to the radius of curvature of the melt at the top of the meniscus, which over the center of the mesa. "Pressure" refers to the pressure difference across the meniscus at the top of the meniscus and it is calculated from the Laplace equation using the radius of curvature of the meniscus at the top of the mesa. "Height, ambient Press" is explained below.

TABLE II

Four characteristics of a Melt on a Mesa with no Ribbon in Place For Four Combinations of Melt Height and Mesa Width

|  | Melt Height = 2 mm | Melt Height = 5 mm |
| --- | --- | --- |
| Mesa width = 20 mm | Angle = 29 degrees<br>Radius of curvature = 0.034 m<br>Pressure = 20.4 Pascal | Angle = 71 degrees<br>Radius of curvature = 0.018 m<br>Pressure = 38.8 Pascal |

TABLE II-continued

Four characteristics of a Melt on a Mesa with no Ribbon in Place For Four Combinations of Melt Height and Mesa Width

|  | Melt Height = 2 mm | Melt Height = 5 mm |
| --- | --- | --- |
| Mesa width = 60 mm | Height, ambient press = 2.9 mm<br>Angle = 21 degrees<br>Radius of curvature = 1.67 m<br>Pressure = 0.4 Pascal<br>Height, ambient press = 2.02 mm | Height, ambient press = 6.7 mm<br>Angle = 54 degrees<br>Radius of curvature = 0.77 m<br>Pressure = 0.9 Pascal<br>Height, ambient press = 5.04 mm |

Figure 8:
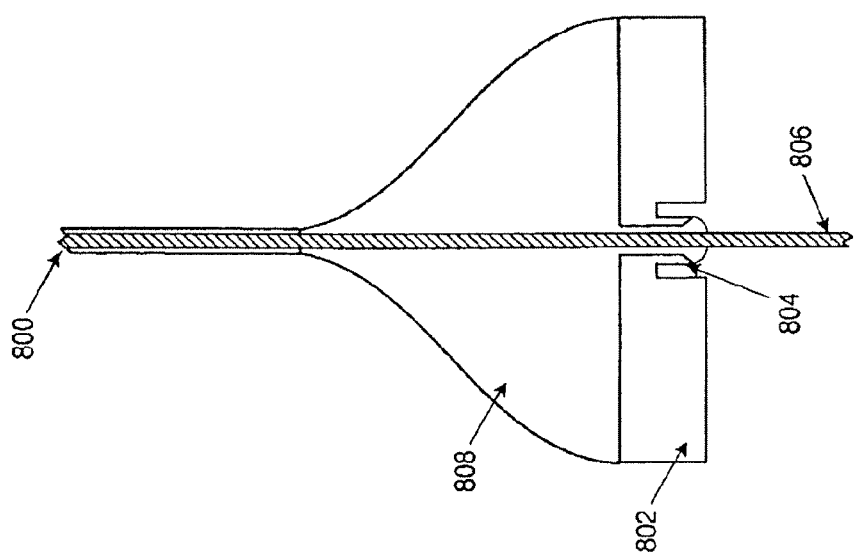
FIG. 8 shows a ribbon growing from a mesa crucible.

FIG. 8 shows a growing ribbon 800 in place, growing from the pool on top of a mesa crucible 802. Note that string introduction tubes 804, as described in U.S. Pat. No. 4,627,887, have been inserted on the bottom of the mesa crucible to allow for the strings 806 defining the edges to come up through the bottom of the crucible. The Finite Difference numerical method described above can be used to calculate the shape of the liquid meniscus 808 on top of the mesa. In this calculation, the width of the mesa is taken as a given. The Finite Difference calculation starts from growth interface and propagates toward the edge of the mesa. At the growth interface, the equilibrium angle between liquid and solid silicon of 11° is from the vertical is assumed. An initial guess is made as to the height of the interface above the edge of the mesa.

A final piece of information is needed for this calculation—the pressure inside the meniscus at some identified height. This is contrasted with the case of the infinite melt pool where the surface far from the ribbon has no curvature and that the liquid immediately under it is therefore at the same pressure as the ambient gas. A convenient approach is to take the height in the liquid silicon at which the pressure is equal to the ambient pressure. As noted above in the discussion of the mesa crucible with no ribbon growing, the curvature at the top of the free melt surface results in an internal pressure in the liquid at the top of the melt pool. Thus, the elevation in the melt pool at which the pressure is equal to the ambient may be calculated by taking the height of the free melt surface outside the region in which the ribbon is growing, and adding to it the height of silicon required to drop the pressure to ambient. This height is tabulated in Table II and identified as "Height, Ambient Press." For example, for the case of the mesa width of 20 mm and the melt height of 5 mm, the pressure difference caused by the curvature at the top of the melt is 38.8 Pascal. This is equivalent to 1.7 mm of silicon. Therefore, a column of liquid silicon 5+1.7=6.7 mm tall is required at ambient pressure.

The numerical solution may now be iterated by choosing starting values of meniscus height until the meniscus passes through the edge of the mesa. FIGS. 9A through 9D show four different meniscus geometries corresponding to two widths of mesa and two different melt heights. These plots show the meniscus height as a function of horizontal position from the surface of the ribbon. Note that in each case, the surface of the meniscus has a point of inflection, that is a point at which the curvature changes from concave down (near the mesa edge) to concave down (near the growth interface). The inflection point is formed in the cross-sectional boundary profile of the melt as the crystalline ribbon is pulled. In the plots of FIG. 9, the vertical axis represents a face of the ribbon (these plots assume that the ribbon is very thin with respect to the width of the mesa). Accordingly, the intercept of the meniscus profile with the vertical axis always has the equilibrium value of 11 degrees required by a growing silicon crystal. The intercept of the profile with the horizontal axes occurs at the edge of the mesa. Note that this angle is different for each of the four plots of FIG. 9. The attachment at the edge allows for a wide range of angles and this is what makes the liquid pool atop the mesa stable over a range of wide melt heights.

Growth from the mesa results in a flatness stabilizing effect. Any motion of the ribbon away from the center of the mesa will result in a tendency to grow back toward the center. As the ribbon is perturbed from the center of the mesa, one face of the ribbon will be closer to one edge of the mesa while the other face will be further from its corresponding edge. The face that is closer will have a lower equilibrium meniscus height while the face that is further will have a higher equilibrium meniscus height. As before, thermal effects coupled with the shape of the meniscus will cause the ribbon to grow in the direction defined by the higher meniscus. Thus, growth from a mesa results in a restoring force causing ribbon to grow flat and centered on the mesa.

We can attain a qualitative understanding for reduction of the equilibrium meniscus height on a face that comes closer to an edge of the mesa by examining two factors. First, the free surface of the melt on the top of the mesa drops as the edge is approached. Second the angle of the free surface changes as the edge is approached. This angle can be considered as a boundary condition where the meniscus joins the free melt surface and the effect of this change in boundary condition is also to lower the equilibrium meniscus height.

The flatness stabilizing effect of the mesa may be calculated from the numerical solution by calculating the equilibrium meniscus height for a ribbon centered on the mesa and for a ribbon displaced slightly off center. Table III tabulates the restoring force calculated by these means. The restoring force is defined in the same manner as above, the change in meniscus height $\Delta s$ for one side of the ribbon as the ribbon moves off-center, divided by the distance that the ribbon has moved off-center.

$$\text{Restoring Tendency} = \frac{\Delta s}{\text{Distance off center}} \quad (10)$$

Table III shows this restoring tendency for the same four cases as are tabulated in Table II. The melt height is that height in a region of the melt on the mesa well away from the growing ribbon. Two values are given in each cell; the "restoring tendency" as described above and the height above the mesa at which the pressure in the melt is the same as the ambient (this is the same as that in Table II).

TABLE III

The Restoring tendency for four combinations of Mesa width and Height of Melt

|  | Height of Melt above Mesa far from ribbon = 2 mm | Height of Melt above Mesa far from ribbon = 5 mm |
| --- | --- | --- |
| Mesa width = 20 mm | "Restoring Tendency" = 0.136 Height, ambient press = 2.9 mm | "Restoring Tendency" = 0.159 Height, ambient press = 6.7 mm |
| Mesa width = 60 mm | "Restoring Tendency" = 0.0023 Height, ambient press = 2.02 mm | "Restoring Tendency" = 0.0048 Height, ambient press = 5.04 mm |

As may be seen from Table III, the restoring tendency is a strong function of the width of the mesa and increases as the width of the mesa decreases. In fact, the restoring tendency due to the mesa can easily exceed the restoring force that the ribbon can induce by growing in a trough. For example, the restoring tendency due to troughing of a 56 mm wide ribbon is 0.08. However, the restoring tendency for a 20 mm wide mesa is 0.159, for the case of the Height of Melt above Mesa far from Ribbon=5 mm—as may be seen by reference to Table III. Thus, the mesa induced restoring tendency is a very substantial effect leading to the growth of a flatter ribbon. Further, the restoring tendency due to the mesa does not change with the width of the ribbon. In contrast, the restoring tendency due to troughing decreases as the ribbon width increases. Thus, the mesa may be used to grow flat, wide ribbon. Note, that the restoring tendencies of the mesa and the troughing effect add, further promoting the growth of flat ribbon.

As can be seen by reference to Table III, the "restoring tendency" varies with both the width of the mesa and the "Height of Melt above Mesa far from ribbon." For convenience the "Height of Melt above Mesa far from ribbon" will be referred to simply as the Melt Height in this discussion. The restoring tendency increases as the width of the mesa is decreased and as the Melt Height t increases. The choice of the width of the mesa is made as a compromise. A narrower mesa will lead to a greater restoring tendency and better ribbon flatness. A wider mesa will place the edges and any particles that accumulate at the edges further from the growth interface. A suitable compromise is a mesa width of 20 mm. The choice of Melt Height is also made as a compromise. A higher value of Melt Height leads to a higher restoring tendency. However, a lower value of Melt Height provides a greater margin of safety against melt spilling over the edge of the mesa—especially in the event of ribbon or ribbons detaching from the melt with the liquid content of their menisci redistributing itself along the mesa. A suitable height above the melt is 1-3 mm. Note that ribbon growth from a mesa is even stable with a melt height of zero (for example in the case of a 20 mm mesa, the restoring tendency for this condition is approximately 0.055). In fact, for a 20 mm mesa, the melt height can go slightly negative (a bit over 1 mm) before the ribbon becomes unstable from a flatness point of view. This provides a margin of safety during manufacturing if temporary interruptions of melt replenishment are encountered during growth (resulting in drawdown of the melt height). However, this is not the preferred mode of operation as the flatness stabilization is much compromised. Even when the mesa is practiced with a slightly negative melt height (below the plane defined by the edges of the mesa), during growth, any detachment of ribbon will result in redistribution of the liquid in the meniscus of the growing ribbon and in an increase in the melt height, typically to a positive value.

Another concern centers on the volume of liquid contained in the meniscus and the effect of a detachment of the meniscus. Periodically, the meniscus may detach from the growing ribbon, and drop down. This might occur for example if the puller momentarily pulls at a higher rate than desired. There is a significant volume of molten silicon in the meniscus, which will fall into the melt pool on the top of the mesa. The mesa crucible must be able to tolerate such a detachment and accommodate the additional molten silicon that previously was contained within the meniscus. A necessary but not sufficient condition is that the mesa be able to accommodate the volume of silicon after it has reached a quiescent stage. This condition may be calculated by calculating the volume of the liquid under the growing ribbon, and calculating the volume of the free melt surface after it redistributes itself. For example, the volume of silicon contained in the meniscus of a ribbon growing from a 20 mm wide mesa in the case where the height of the melt far from the ribbon is 2 mm (the case of FIG. 9a) is 0.76 cubic centimeters per centimeter of ribbon width. However, a 20 mm wide mesa can hold molten silicon at a height of up to approximately 6 mm, at which point the volume of melt is approximately 0.95 cubic centimeters per centimeter of mesa length. Thus, if the meniscus of the ribbon collapses, the mesa can accommodate the additional melt. This calculation is for the extreme case where the ribbon extends for the full length of the mesa. Ordinarily there will be additional mesa area outside of the growing ribbon that will be able to further accommodate the melt from a collapsed meniscus. Note, that if the melt height during growth is too close to the maximum height that a mesa can hold, the melt from a collapsed meniscus will result in spillage over the side of the mesa.

A more stringent condition results from the fact that when the meniscus collapses as the detached meniscus falls, the fluid within it, acquires some velocity. The momentum of this fluid then initiates a small wave and this wave propagates to the edge of the mesa. The mesa must be able to absorb the shock of this wave without spilling over the edge. Experimentally it has been found that the mesa is quite resistant to this wave shock. This may be due to the fact that the meniscus does not detach across the full width of the ribbon simultaneously, but rather the detachment begins at one point and propagates across the ribbon width. The impact of this detachment is thus minimized.

Another use of the flatness stabilization aspect of the mesa is to mitigate or completely compensate for the destabilizing effect of inadvertently pulling the ribbon at an angle from the vertical. As noted earlier, pulling at an angle from the vertical from an large melt pool will result in an increase in the meniscus height on the underside of the ribbon, which will in turn result in the center of the ribbon growing toward the direction of the pull and a trough shaped ribbon, as shown in FIG. 4. On a large melt pool, this trough will only stabilize once it has reached a significant depth and the difference in curvatures of the two sides of the ribbon is enough to equalize the meniscus heights on the two sides of the ribbon. However, the mesa brings a strong stabilizing factor into play as the motion of the center of the ribbon away from the center of the mesa will raise the meniscus on the side of the ribbon closer to the center and lower it on the side further from the center. This effect quickly leads to the equalization of the meniscus heights on the two sides of the ribbon with only a small deviation of the center of the ribbon from the flat condition.

However, it is possible to achieve an even higher degree of flatness in the presence of unintentional pulling at an angle from the melt. If, the ribbon is pulled at an angle to the melt and the position of the strings is defined by passage through an orifice, the position of growth of the ribbon will be displaced from the center of the mesa. As noted above, such displacement from the center of the mesa will cause the meniscus on the side of the ribbon closer to the center of the mesa to be higher than the meniscus on the side of the ribbon facing away from the center. However, the angle of pulling will cause the meniscus on the side closer to the center to be lower than the meniscus on the side of the ribbon facing away from the center. If the proper geometry is selected, these two effects can cancel each other resulting in the growth of flat ribbon at an angle to the melt.

Figure 10:
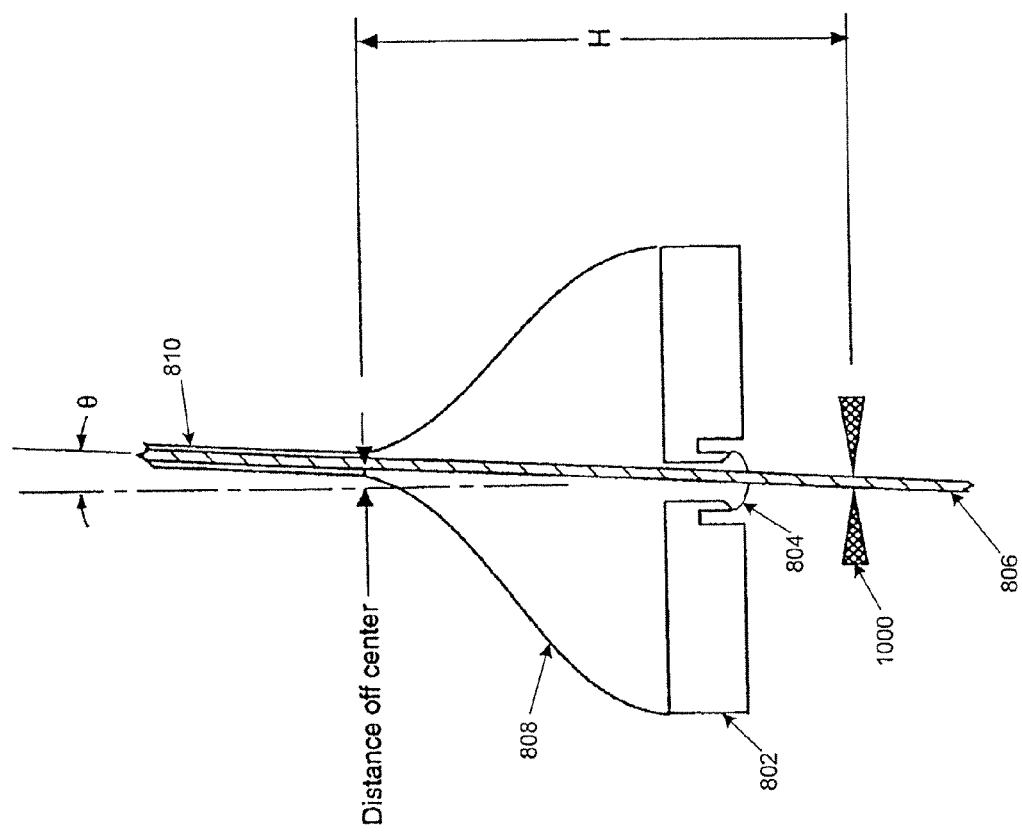
FIG. 10 shows the growth of ribbon from a mesa crucible at a slight angle to the vertical.

FIG. 10 shows a ribbon 810 being pulled from a mesa 802 at a slight angle to the vertical and defines three relevant geometric parameters. The angle of the ribbon with respect to the vertical is denoted as $\theta$. The vertical height between the growth interface and the point of confinement of the strings 1000 is denoted as H. The third parameter is the horizontal distance between the center of the mesa and the center of the ribbon, denoted as Distance off Center. These are related as follows:

$$\text{Distance off Center} = H\theta \quad (11)$$

We may relate the angle of pulling to the difference in meniscus height, $\Delta s$ in a manner analogous to that used in Equation 5

$$\Delta s = r\theta = \frac{\gamma}{\rho g b}\theta = \frac{\alpha\theta}{b} \quad (12)$$

where r is the radius of curvature at the top of the meniscus and where b is vertical distance between the growth interface and the height at which the pressure inside the melt is the same as that in the ambient outside the liquid.

Pulling at an angle from the vertical produces a destabilizing tendency—a tendency to grow into a trough. For the case where the angle of pulling can be related to the Distance off Center by equation 11, this destabilizing tendency can be defined by analogy to equation 10 as:

$$\text{Destabilizing Tendency} = \frac{\Delta s}{\text{Distance off center}} \quad (13)$$

Substituting equations 11 and 12 into equation 13 gives:

$$\text{Destabilizing Tendency} = \frac{\Delta s}{\text{Distance off center}} \quad (14)$$
$$= \frac{\alpha\theta/b}{H\theta}$$
$$= \frac{\alpha}{Hb}$$

However, the mesa itself has a Restoring Tendency as summarized in Table III. In a case where the Destabilizing Tendency of equation 14 is equal in magnitude to the Restoring Tendency of the mesa, the net result will be that the ribbon can grow at an angle to the melt and remain flat. Thus, an unintentional pulling at an angle to the melt will not create a trough shaped ribbon.

FIG. 11 shows an isometric view of a graphite mesa crucible. The width of the mesa crucible shown in FIG. 11 is 20 mm. In operation, silicon overfills this crucible to a typical height of approximately 1-2 mm above the plane defined by edges 1200. The small depression in the top 1202 allow for the silicon to stay wetted to the edge even when the silicon level drops to the level of the edges 1200. While a flat top mesa might de-wet as the melt height drops, this crucible will not de-wet. The strings come up through string introduction holes 1204 and the ribbon is puled between these. The ¼-circle cutouts in the bottom of the crucible 1208 accept heaters, one on each side of the crucible. Support ears 1210 support the crucible.

As described above, the mesa crucible has a top surface and edges defining a boundary of the top surface of the mesa crucible. The melt is formed on the top surface of the mesa crucible, and the edges of the melt are retained by capillary attachment to the edges of the mesa crucible. The crystalline ribbon is then pulled from the melt. In various embodiments, a seed is placed in the melt, and the seed is pulled from the melt between a pair of strings positioned along the edges of the crystalline ribbon. The melt solidifies between the pair of strings to form the crystalline ribbon. The crystalline ribbon may be continuously pulled from the melt continuously.

The mesa crucible and all concepts described herein can be applied to the concurrent growth of multiple ribbons from a single furnace. In this case, the length of the crucible is increased, while maintaining the approximate width and height. FIG. 12 shows an isometric view of a graphite mesa crucible suitable for the growth of multiple ribbons, e.g., four ribbons, each of width 81.3 mm with 38.1 mm between adjacent ribbons. The mesa is defined by edges 1304 and is 20 mm wide and 650 mm long. The corners of the mesa 1314 are rounded to increase the durability of the crucible and to reduce the possibility of a leak occurring at a sharp corner. There are eight string introduction holes 1302, two for each ribbon. The left-most two are annotated in the isometric drawing—corresponding to the left-most ribbon. The crucible is supported in the furnace by tangs 1300. Section 1 shows a cross section through the region between strings. This same cross section applies to the majority of the crucible. Section 2 shows a cross section through one of the eight holes used to introduce string. Recess 1306, running the full length of the mesa is approximately 1 mm deep and helps to guarantee that the silicon does not de-wet from the edge. This recess also provides a bit extra depth of liquid silicon to receive the granular silicon feedstock during replenishment. Note from section 1 and section 2 that the edge of the mesa need not be a "knife-edge" but rather can have a small flat 1318 (or land) to improve its durability, as evident in "Detail A" which is an enlargement of the top-left corner of Section 1. Typically this flat might be 0.25 mm wide. Melt replenishment is accomplished by dropping granular material in the general area marked as 1316 and generally the material will be distributed over a length of crucible of approximately 100 mm in the manner previously described. The melt replenishment can be performed at one end of the crucible—as is contemplated in FIG. 12. Alternatively, the melt replenishment can be performed in the center of the crucible with two or more ribbons grown to either side. Further, the mesa need not be of a uniform width along its entire length, although uniform width does present economy of manufacture. In particular, the region in which melt replenishment is performed may be a different width, especially wider than the region where ribbon is grown. In this manner, the melt-in of feedstock will be facilitated without decreasing the "Restoring Tendency" of the mesa crucible. Cutouts 1310 are to accommodate heaters. Suitable grades of graphite for use in the growth of silicon ribbon include grade G530 available from Tokai and grade R6650 available from SGL Carbon. It will be appreciated that with a long crucible it is particularly important to have the crucible be level so that the melt will be uniformly distributed along the length and not accumulate substantially at one end. Typically the crucible is leveled to at least within 0.2 mm along the length.

The new charge of silicon is continually dropped in the region 1205. Typically, silicon "BB's" made by fluidized bed using the thermal decomposition of silane and provided by MEMC Corp. are used to replenish the melt continuously as ribbon is grown, although other granular forms of silicon feedstock can be used as known in the art. For "BB's", the size ranges from approximately 1 mm diameter to 4 mm diameter. FIG. 13 shows a technique to accomplish melt replenishment of a mesa crucible which minimizing the mechanical (e.g. splashing) and thermal disturbance to the system. A mesa crucible 1404 is held inside a metal furnace shell 1402 (the crucible is held by the end tangs, one of which is evident in FIG. 13, however, the supports which mate to these tangs are not shown). Insulation 1400 helps to maintain the crucible at temperature. The granular silicon feedstock will be transported into the furnace through a horizontally, or substantially horizontal tube 1406. The tube may be made of any refractory material, however, quartz tubing is a good choice for silicon crystal growth as it is chemically compatible, economical and has good resistance to thermal shock. Further, the elastic modulus of quartz is reasonably high and this is helpful as explained below. Tube 1406 is clamped into trough 1414 by clamp 1426. The trough/tube assembly is support atop a vibratory feeder 1416, such as those know in the art. The vibratory feeder can move left and right (it sits on a track, not shown, and is moved by a motor as is well know in the art). FIG. 13a shows the tube/trough/vibrator assembly in its right-most position—furthest out of the furnace. FIG. 13b shows the tube/trough/vibrator assembly in its left-most position—furthest into the furnace. Hopper 1410 is used to hold the granular feedstock, which is metered out by device 1412. Suitable methods of metering are described in U.S. Pat. Nos. 6,090,199 and 6,217,649. Enclosure 1418 serves to isolate the contents from air and the enclosed volume is in communication with the interior of the furnace through the hole in 1402 through which tube 1406 penetrates. FIGS. 13a and 13b show the hardware without silicon present, for clarity.

FIGS. 13c and 13d illustrate the cycle used in feeding. As the tube is withdrawn from the furnace, the vibrator is turned on and the silicon feedstock is transported down the tube and falls on the melt 1420, which is atop the mesa crucible. The tube and trough move together as a single unit and the tube must be stiff enough and light enough to enforce motion as a rigid body so that the vibration will be well defined (hence the advantage of high elastic modulus). The stiffness to weight ratio of the tube can also be increase by increasing its outside diameter, while keeping the wall thickness the same. However, the tube cannot be made so large that the heat loss down the tube and out the furnace is too large or that the location of the BB's when they drop is too ill-defined to guarantee that they land on the mesa. For a 20 mm wide mesa a quartz tube of 14 mm OD and 1 mm wall has been found suitable. The amplitude of vibration is adjusted so that the traverse time for a BB down the tube is on the same order as the time required to complete one in/out cycle, or not too much greater that this time. As long as this time is kept fairly short, the tube acts to rapidly transport the metered feedstock in and back-ups and tube plugging are prevented. At the same time, too high a vibrational amplitude will result in BB's "spraying" out the end and therefore not necessarily dropping where intended. The drop from tube to melt is small, typically 10 mm. This helps to avoid splashing and waves on the liquid silicon. It also minimizes the chance that a BB will bounce off another BB present in the melt and fall outside the mesa. The possibility of BB's falling on top of one another is further reduced by withdrawing the tube during feeding so that, for the most part, BB's fall on clear melt. Distributing the BB's along a length of the mesa also has the advantage of distributing the cooling effect of the BB's and thereby reducing the overheat needed in the crucible to melt the BB's. Note that the silicon BB's float on the surface of the melt due to the lower density of solid silicon (as compared to liquid silicon) and due to surface tension effects. The BB's may tend to stay in the center of the mesa or go to the edges, depending on factors including the curvature of the melt and the direction of the temperature gradient across the mesa.

In FIG. 13d, the tube/trough/vibrator is moving back into the furnace with the vibrator turned off and no silicon feeding in order to minimize the number of collisions of BB's. A few BB's which remain on the melt are almost fully melted at this stage and will be fully melted by the time the tube returns to the right-most position on the next withdrawal stroke. Typically, the feeding/withdrawal stroke takes approximately 5 seconds, the return stroke approximately 1 second and the traverse time of BB's in the tube approximately 10 sec. The metering device and hopper may be fixed and need not move with the tube/trough/vibrator. In this case, the trough needs to be long enough to capture the BB's over the full travel.

It will be appreciated that temperature control must be adequately maintained along the length of the crucible so as to grow ribbon of predictable and consistent thickness. This may be accomplished by positioning small, "trimming" heater elements along the length of the crucible, beneath the crucible. Such methods are well known in the art of high temperature furnace design. Another method of maintaining the temperature along the length of the crucible is to provide for movable portions of the insulation pack, which surrounds the crucible, as shown in FIG. 14. Mesa crucible 1500 is disposed within furnace shell 1504 and held in place by supports not shown. Lower insulation pack 1506 is shown, however, all insulation above the crucible has been omitted for clarity. Replenishment feed tube 1502 is shown for reference. The lower insulation pack 1506 has openings 1520. Three movable insulation elements are shown an these elements are actuated from outside the furnace by rods 1508, 1510, and 1512. Examining the rightmost movable element, we see a piece of insulation 1514 on top of a plate 1516 attached to actuation rod 1512. Plate 1516 acts to support the fragile insulation. The rightmost movable element is in the fully-up position, resulting in minimum heat loss. The center element is fully down, resulting in maximum heat loss. The left-most element is in the middle, resulting in an intermediate heat loss condition. The rods may be positioned by hand or by an electro-mechanical positioning mechanism as is known in the art, the latter allowing for automated control of position.

The invention, as described herein, has been described in the context of String Ribbon. However, the mesa crucible can be applied to other methods of growing ribbons and sheets including, but not limited to, the Edge-defined Film-fed Growth (EFG) of crystalline ribbons. For example, a mesa crucible shaped in a closed polygon may be used to grow such a hollow, polygonal crystalline ribbon.

While the invention has been particularly shown and described with reference to specific illustrative embodiments, various changes in form and detail may be made without departing from the spirit and scope of the invention as defined by the appended claims.

What is claimed is:

1. A method of forming a crystalline ribbon, the method comprising:
    providing a crucible having a top surface with edges defining a boundary of the top surface of the crucible and a pair of side walls extending downward from opposing edges of the top surface;
    forming a melt of a source material on the top surface of the crucible, the top surface supporting substantially all of the melt, the edges of the top surface wetting the melt and retaining the melt by capillary attachment to the top surface of the crucible; and
    pulling a crystalline ribbon from the melt.

2. The method of claim 1, wherein the pulling step comprises:
    placing a seed in the melt;
    pulling the seed from the melt between a pair of strings positioned along the edges of the crystalline ribbon, thereby solidifying the melt between the pair of strings to form the crystalline ribbon; and
    continuously pulling the crystalline ribbon from the melt.

3. The method of claim 1, wherein at least a portion of a boundary profile of the melt is concave downward prior to the pulling step.

4. The method of claim 1, wherein at least a portion of a boundary profile of the melt is concave downward outside the region of the crystalline ribbon.

5. The method of claim 1, wherein pulling the crystalline ribbon from the melt forms an inflection point in a cross-sectional boundary profile of the melt.

6. The method of claim 5, wherein the inflection point in at least a portion of the cross-sectional boundary profile of the melt predisposes the crystalline ribbon to grow substantially flat.

7. The method of claim 1 further comprising:
    forming a portion of the melt above the edges of the crucible.

8. The method of claim 1 further comprising:
    forming more than one crystalline ribbon.

9. The method of claim 1 further comprising:
    replenishing the source material on the top surface of the crucible for continuous crystalline ribbon growth.

10. The method of claim 1 further comprising:
    controlling the temperature of the crucible while forming the crystalline ribbon.

11. The method of claim 1 further comprising:
    positioning an insulator comprising movable elements along the crucible;
    disposing the crucible in a furnace; and creating controlled heat leaks by moving the moveable elements of the insulator relative to the crucible to control the temperature of the crucible.

12. The method of claim 11, wherein rods connected to the moveable elements penetrate the furnace and are controlled from outside the furnace.

13. The method of claim 1 further comprising distributing the source material onto the crucible, thereby reducing the heat load required to melt the source material.

14. The method of claim 13, wherein the distributing step comprises:
    positioning a feeder at a distance from the crucible;
    moving a feeder in a first direction and a second direction along the crucible; and
    vibrating the feeder during motion in at least one of the first direction and the second direction, such that the source material disposed within the feeder enters the melt on the during such motion.

15. The method of claim 14, further comprising:
    melting the source material prior to source material from a subsequent motion in the first direction reaching the melt.

16. The method of claim 14, wherein the distance between the feeder and the crucible is less than the width of the crucible.

17. The method of claim 1, wherein the edges of the crucible define a recessed top surface of the crucible.

18. The method of claim 1, wherein the edges of the top surface retain substantially all of the melt by capillary attachment to the top surface of the crucible.

19. The method of claim 1, wherein pulling comprises pulling a plurality of crystalline ribbons from the melt.

20. The method according to claim 19, pulling comprising:
    placing a plurality of seeds in the melt, each seed having a pair of strings;
    pulling from the melt each pair of strings to form the plurality of crystalline ribbons; and
    pulling the plurality of crystalline ribbons from the melt.

21. A method according to claim 1, wherein the crystalline ribbon is pulled vertically from the melt.

22. A method of forming a crystalline ribbon, the method comprising:
    providing a crucible having a top surface with edges defining a boundary of the top surface of the crucible and a pair of side walls extending downward from opposing edges of the top surface;
    forming a melt of a source material on the top surface of the crucible, the top surface supporting substantially all of the melt, the edges of the top surface wetting the melt and the melt having a boundary profile at least a portion of which is concave downward; and
    pulling a crystalline ribbon from the melt.

23. The method of claim 22, wherein the pulling step comprises:
    placing a seed in the melt;
    pulling the seed from the melt between a pair of strings positioned along the edges of the crystalline ribbon, thereby solidifying the melt between the pair of strings to form the crystalline ribbon; and
    continuously pulling the crystalline ribbon from the melt.

24. The method of claim 22, wherein the width of the crucible is between about 15 mm and about 30 mm.

25. The method of claim 22, wherein the crucible is a mesa crucible.

26. The method of claim 22, wherein the edges of the crucible define a recessed top surface of the crucible.

27. A method according to claim 22, wherein the crystalline ribbon is pulled vertically from the melt.

28. A method of forming a crystalline ribbon, the method comprising:
    providing a crucible having a top surface with edges defining a boundary of the top surface of the crucible and a pair of side walls extending downward from opposing edges of the top surface;
    forming a melt of a source material on the top surface of the crucible, the top surface supporting substantially all of the melt, the edges of the top surface wetting the melt and the melt having a boundary profile; and
    pulling a crystalline ribbon from the melt, thereby forming an inflection point in at least a portion of a cross-sectional boundary profile of the melt.

29. The method of claim 28, wherein the pulling step comprises:
    placing a seed in the melt; and pulling the seed from the melt between a pair of strings positioned along the edges of the crystalline ribbon, thereby solidifying the melt between the pair of strings to form the crystalline ribbon; and
    continuously pulling the crystalline ribbon from the melt.

30. The method of claim 28, wherein the crucible is a mesa crucible.

31. The method of claim 28, wherein the edges of the crucible define a recessed top surface of the crucible.

32. A method according to claim 28, wherein the crystalline ribbon is pulled vertically from the melt.

33. A method of forming a crystalline ribbon, the method comprising:
    providing a crucible having a top surface with edges defining a boundary of the top surface of the crucible and a pair of side walls extending downward from opposing edges of the top surface;
    forming a melt of a source material on the top surface of the crucible, the top surface supporting substantially all of the melt, the edges of the top surface wetting the melt and a portion of the melt being above the edges of the crucible; and
    pulling a crystalline ribbon from the melt.

34. The method of claim 33, wherein the pulling step comprises:
    placing a seed in the melt; and
    pulling the seed from the melt between a pair of strings positioned along the edges of the crystalline ribbon, thereby solidifying the melt between the pair of strings to form the crystalline ribbon; and
    continuously pulling the crystalline ribbon from the melt.

35. The method of claim 33, wherein the crucible is a mesa crucible.

36. The method of claim 33, wherein the edges of the crucible define a recessed top surface of the crucible.

37. A method according to claim 33, wherein the crystalline ribbon is pulled vertically from the melt.

* * * * *